United States Patent
Kim et al.

(10) Patent No.: US 7,181,071 B2
(45) Date of Patent: Feb. 20, 2007

(54) METHOD AND APPARATUS FOR ENCODING AND DECODING KEY VALUE DATA OF ORIENTATION INTERPOLATOR NODE

(75) Inventors: Do-kyoon Kim, Kyungki-do (KR); Seok-yoon Jung, Seoul (KR); Euee-seon Jang, Seoul (KR); Sang-oak Woo, Kyungki-do (KR); Shin-jun Lee, Seoul (KR); Mahn-jin Han, Kyungki-do (KR); Gyeong-ja Jang, Kyungki-do (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 684 days.

(21) Appl. No.: 10/305,331

(22) Filed: Nov. 27, 2002

(65) Prior Publication Data

US 2003/0108107 A1    Jun. 12, 2003

Related U.S. Application Data

(60) Provisional application No. 60/369,597, filed on Apr. 4, 2002, provisional application No. 60/342,101, filed on Dec. 26, 2001, provisional application No. 60/334,541, filed on Dec. 3, 2001, provisional application No. 60/333,130, filed on Nov. 27, 2001.

(30) Foreign Application Priority Data

Nov. 13, 2002    (KR) .................. 10-2002-0070496

(51) Int. Cl.
  *G06K 9/36*    (2006.01)
(52) U.S. Cl. .................................... 382/236
(58) Field of Classification Search ............ 382/236
  See application file for complete search history.

(56) References Cited

U.S. PATENT DOCUMENTS 6,075,901 A    6/2000 Signes et al.

(Continued)

FOREIGN PATENT DOCUMENTS

JP    9182082    7/1997

(Continued)

OTHER PUBLICATIONS

EPO Search Report dated Apr. 18, 2005.

(Continued)

*Primary Examiner*—Wenpeng Chen
*Assistant Examiner*—Yuzhen Ge
(74) *Attorney, Agent, or Firm*—Buchanan Ingersoll & Rooney, PC

(57) ABSTRACT

A method and an apparatus for encoding key value data of an orientation interpolator representing the rotation of an object in a keyframe image are provided. The apparatus includes a rotational differential data generator which generates, using a rotational transformation value of a current keyframe and a restored rotational transformation value of a previous keyframe, a rotational differential value used to rotate the object by as much as a difference between rotational transformation applied to the object in the current keyframe by key value data and rotational transformation applied to the object in the previous keyframe by key value data, and outputs rotational differential data by quantizing the rotational differential value, a circular DPCM operator which selectively performs a linear DPCM operation or a circular DPCM operation on rotational differential data, and an entropy encoder which entropy-encodes the rotational differential data.

28 Claims, 24 Drawing Sheets

U.S. PATENT DOCUMENTS

| | | | |
|---|---|---|---|
| 6,204,854 B1* | 3/2001 | Signes et al. | 345/427 |
| 6,529,086 B2* | 3/2003 | Kim et al. | 332/106 |
| 6,549,206 B1* | 4/2003 | Signes | 345/473 |
| 6,693,645 B2* | 2/2004 | Bourges-Sevenier | 345/619 |
| 2002/0097246 A1* | 7/2002 | Jang et al. | 345/474 |
| 2003/0103572 A1 | 6/2003 | Lee et al. | |
| 2003/0103573 A1 | 6/2003 | Lee et al. | |
| 2003/0128215 A1 | 7/2003 | Kim et al. | |
| 2003/0128884 A1 | 7/2003 | Lee et al. | |
| 2003/0147470 A1 | 8/2003 | Lee et al. | |

FOREIGN PATENT DOCUMENTS

| | | |
|---|---|---|
| KR | P1997-0073126 | 11/1997 |
| WO | WO 01/41156 | 7/2001 |

OTHER PUBLICATIONS

Korean Office Action dated Apr. 19, 2005 with English Translation.

Kim et al., "Animation Data Compression in MPEG-4: Interpolators", Proceedings 2002 International Conference on Image Processing, ICIP 2002, Sep. 22-25, 2002, vol. 2 of 3, IEEE, New York.

MPEG: "Call for Proposals for Interpolator Compression N4098", ISO IEC JTC1 SC29 WG11, Mar. 2001, pp. 4-6, Singapore.

Han et al., "InterpolatorCompression Core Experiments Description N4364", URL:http://www.chiariglione.org/mpeg/working_documents/mpeg-04/systems/interpolator_compression_ce.zip>, Jul. 2001, Sydney.

Jang, "3D Animation Coding: its History and Framework", Multimedia and Expo, 2000, ICME 2000, 2000 IEEE International Conference on New York, Jul. 30-Aug. 2, 2000, vol. 2, pp. 1119-1122, Piscataway, New Jersey.

Signes, "Binary Format for Scene (BIFS): Combining MPEG-4 Media to Build Rich Multimedia Services", Proceedings of the SPIE, Jan. 25, 1999, vol. 3653, pp. 1506-1517, San Jose, California.

* cited by examiner

FIG. 5C
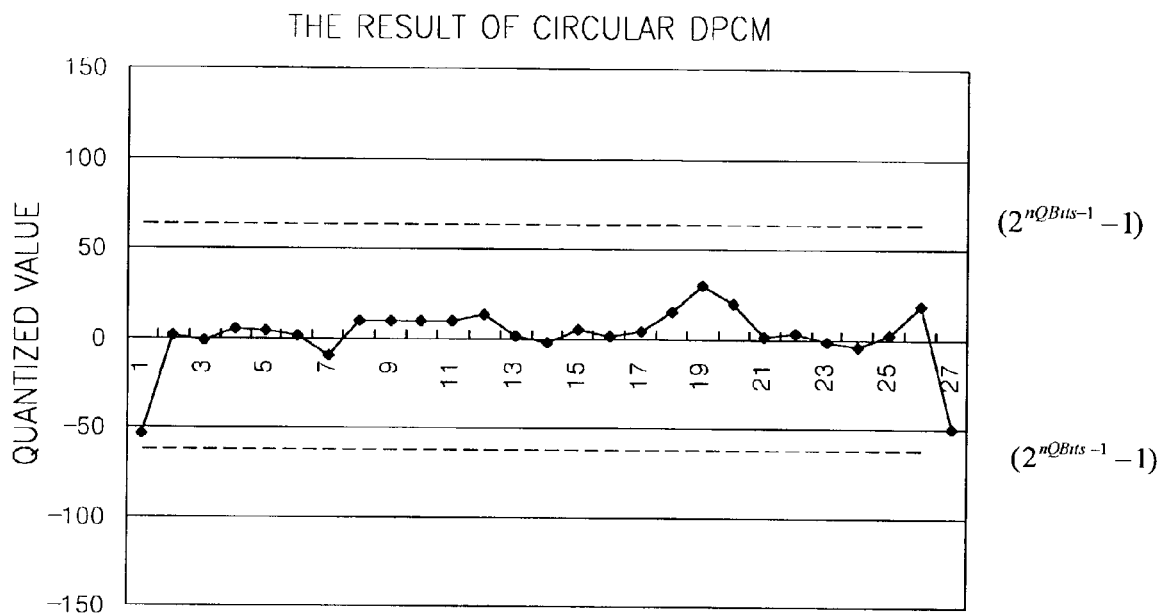
FIG. 6A
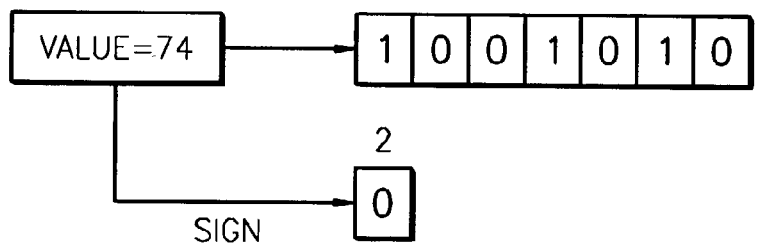
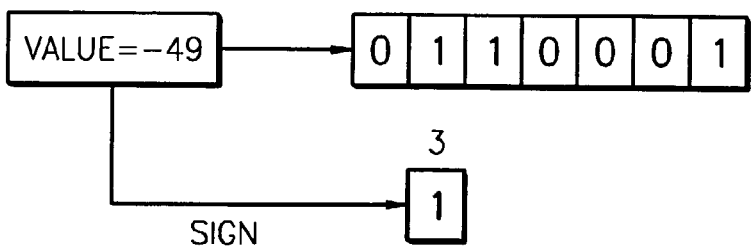

FIG. 12

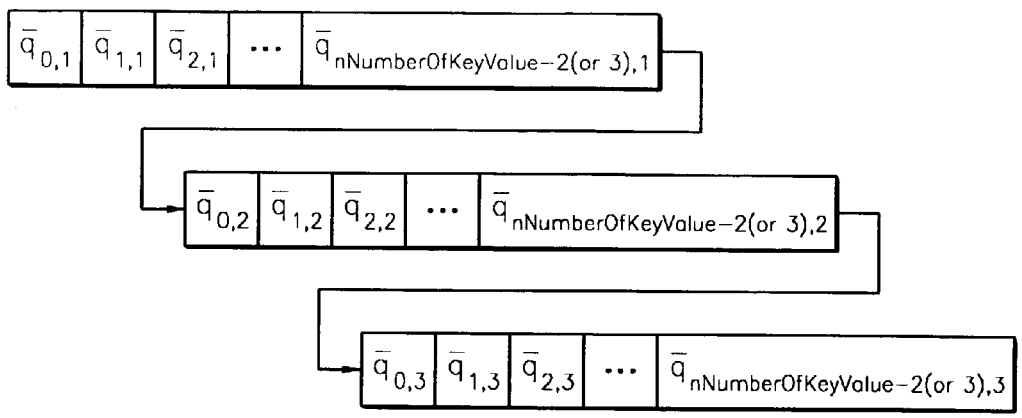

FIG. 13A

```
class CompressedOrientationInterpolator {
    OriIKeyValueHeader oriIKVHeader;
    qf_start();
    if(oriIKVHeader.nKVDPCMOrder == 0)   //1st order DPCM
        OriIDPCMKeyValue oriIDPCMKeyValue(oriIKVHeader.oriIDPCMKVHeader,
    oriIKVHeader.nNumberOfKeyValue-1);
    else    //2nd order DPCM
        OriIDPCMKeyValue oriIDPCMKeyValue(oriIKVHeader.oriIDPCMKVHeader,
    oriIKVHeader.nNumberOfKeyValue-2);
}
```

FIG. 13B

```
class OriIKeyValueHeader () {
    unsigned int(5) nKVQBit;
    unsigned int(5) nNumKeyValueCodingBit;
    unsigned int(nNumKeyVaueCodingBit) nNumberOfKeyValue;
    bit(1) nKVDPCMOrder;
    OriIDPCMKeyValueHeader oriIDPCMKVHeader(nKVQBit, nKVDPCMOrder);
}
```

FIG. 13C

```
class OriIDPCMKeyValueHeader (int nKVQBit, unsigned int nKVDPCMOrder) {
    unsigned int(nKVQBit-1) firstQKV_S;
    bit(1) nFirstXSign;
    unsigned int(nKVQBit-1) firstQKV_X;
    bit(1) nFirstYSign;
    unsigned int(nKVQBit-1) firstQKV_Y;
    bit(1) nFirstZSign;
    unsigned int(nKVQBit-1) firstQKV_Z;
    if (nKVDPCMOrder==1) {      //2nd order DPCM
    bit(1) nSecondXSign;
    unsigned int(nKVQBit-1) secondQKV_X;
    bit(1) nSecondYSign;
    unsigned int(nKVQBit-1) secondQKV_Y;
    bit(1) nSecondZSign;
    unsigned int(nKVQBit-1) secondQKV_Z;
    bit(1) bIsMoreTwoKVs;
    }
    if (nKVDPCMOrder==0 || bIsMoreTwoKVs==1) {
    bit(1) x_keyvalue_flag;
    OriIKeyValueCodingBit oriIKVCodingBit_X(x_keyvalue_flag, nKVQBit);
    bit(1) y_keyvalue_flag;
    OriIKeyValueCodingBit oriIKVCodingBit_Y(y_keyvalue_flag, nKVQBit);
    bit(1) z_keyvalue_flag;
    OriIKeyValueCodingBit oriIKVCodingBit_Z(z_keyvalue_flag, nKVQBit);
    }
}
```

FIG. 13D

```
class OrilKeyValueCodingBit (unsigned int flag_bit, int nKVQBit) {
    int count = (int)(log10(nKVQBit)/log10(2)) + 1;
    if(flag_bit == 0) {
        unsigned int(count) nKVCodingBit;
        if(nKVCodingBit == 1)
            unsigned int(nKVCodingBit) nAllKeyValue;
        else {
            bit(1) nSign;
            unsigned int(nKVCodingBit-1) nAllKeyValue;
        }
    } else {
        bit(1) bIsUnaryAAC;
        if(bIsUnaryAAC != 1)
            unsigned int(count) nKVCodingBit;
    }
}
```

FIG. 13E

```
class OriIDPCMKeyValue(OriIDPCMKeyValueHeader kvHeader, int nNumKV) {
    int i;
    if(kvHeader.x_keyvalue_flag != 0) {
        if(kvHeader.oriIKVCodingBit_X.bIsUnaryAAC == 1)
            for(i = 0;i < nNumKV;i++)
                decodeUnaryAAC(&DeltaKeyValue[i].x, kVXSignContext,
kVXUnaryContext);
        else
            for(i = 0;i < nNumKV;i++)
                decodeSignedAAC(&DeltaKeyValue[i].x,
kvHeader.oriIKVCodingBit_X.nKVCodingBit, kVXSignContext, kVXContext);
    }
    if(kvHeader.y_keyvalue_flag != 0) {
        if(kvHeader.oriIKVCodingBit_Y.bIsUnaryAAC == 1)
            for(i = 0;i < nNumKV;i++)
                decodeUnaryAAC(&DeltaKeyValue[i].y, kVYSignContext,
kVYUnaryContext);
        else
            for(i = 0;i < nNumKV;i++)
                decodeSignedAAC(&DeltaKeyValue[i].y,
kvHeader.oriIKVCodingBit_Y.nKVCodingBit, kVYSignContext, kVYContext);
    }
    if(kvHeader.z_keyvalue_flag != 0) {
        if(kvHeader.oriIKVCodingBit_Z.bIsUnaryAAC == 1)
            for(i = 0;i < nNumKV;i++)
                decodeUnaryAAC(&DeltaKeyValue[i].z, kVZSignContext,
kVZUnaryContext);
        else
            for(i = 0;i < nNumKV;i++)
                decodeSignedAAC(&DeltaKeyValue[i].z,
kvHeader.oriIKVCodingBit_Z.nKVCodingBit, kVZSignContext, kVZContext);
    }
}
```

METHOD AND APPARATUS FOR ENCODING AND DECODING KEY VALUE DATA OF ORIENTATION INTERPOLATOR NODE

This application claims the priority of Korean Patent Application No. 2002-70496, filed Nov. 13, 2002, in the Korean Intellectual Property Office. This application also claims the benefit of U.S. Provisional Application No. 60/333,130, filed Nov. 27, 2001; U.S. Provisional Application No. 60/334,541, filed Dec. 3, 2001; U.S. Provisional Application No. 60/342,101, filed Dec. 26, 2001; and U.S. Provisional Application No. 60/369,597, filed Apr. 4, 2002. The entire contents of these applications are incorporated herein by reference.

BACKGROUND OF THE INVENTION

1. Field of the Invention

The present invention relates to a method and an apparatus for encoding and decoding key value data of an animation, and more particularly, to a method and an apparatus for encoding and decoding key value data of an orientation interpolator node, which are converted into quaternion by encoding and decoding differences among orientation-converted values applied to an object in each keyframe.

2. Description of the Related Art

MPEG-4 BIFS, which is one of the international multimedia standards, supports a keyframe-based animation using an interpolator node having keys and key values of an animation.

In order to represent animation as naturally and smoothly as possible using such a keyframe-based animation technique, a considerable number of keys and a considerable amount of key value data are required, and field data between key frames are filled in by interpolation. Interpolation in a virtual reality modeling language (VRML) involves linear or spherical interpolation.

Keys and key values approximate an original animation curve on a temporal axis. FIG. 1 is a diagram illustrating two-dimensional trajectories of animation data, represented by an orientation interpolator node, in accordance with the passage of time on the surface of a three-dimensional sphere. As shown in FIG. 1, the conventional MPEG-4 BIFS supports spherical linear interpolation between keyframes, and an animation path looks similar to a set of segments representing the variation of the animation data.

In an orientation interpolator node provided by BIFS, key data indicate a predetermined moment of time on a temporal axis where an animation is located using discontinuous numbers between $-\infty$ and $\infty$. Key value data represent information on the rotation of an object in a synthetic image at a predetermined moment of time indicated by key data. Information on the rotation of the object at another predetermined moment of time, which is not represented by key data, is obtained using key data corresponding to two moments of time, which are most adjacent to the predetermined moment of time, by spherical linear interpolation.

In spherical linear interpolation, rotation information is represented by a rotation axis and a rotation angle. MPEG-4 BIFS, like virtual reality modeling language (VRML), supports rotation information represented by a rotation axis and a rotation angle using an orientation interpolator node. When generating a smooth animation using key value data in spherical linear interpolation, differential values of key value data between keyframes are highly correlated with each other, which causes redundancy among data. Accordingly, it is effective to use a method for encoding key value data using differential values of data.

MPEG-4 BIFS provides two different methods for encoding field data represented by keys and key value data of an orientation interpolator node. One is a method for encoding field data using pulse code modulation (PCM) and the other is a method for encoding field data using differential pulse code modulation (DPCM) and entropy encoding.

In the method for encoding field data using PCM, only a quantization process is performed on key data and key value data to be encoded. Since the characteristics of data to be encoded are not considered in this method, this method is considered ineffective. In the method for encoding field data using PCM, field data of an orientation interpolator node are input, and key value data of the field data are converted into values in a quaternion space. Next, keys and key value data are quantized. Quantized field data are output in the form of binary data. In order to measure the degree to which the results of quaternion transformation are visually distorted as compared with original field data, the binary data are restored into key value data consisting of a rotation axis and a rotation angle. Restored field data of an orientation interpolator node are stored and then are output on a screen. It is possible to measure the degree of visual distortion of images caused by a quaternion error using the restored data. Distortion of images can be calculated with Equation (1) below.

$$D = \sqrt{\left(\frac{\sum_{i=0}^{i<N} \varepsilon_i}{N}\right)^2} = \sqrt{\left(\frac{\sum_{i=0}^{i<N} Q_i - \hat{Q}_i}{N}\right)^2} \quad (1)$$

In Equation (1), N represents the number of field data, and $\varepsilon_i$ represents a differential value between encoded key value data $Q_i$ and key value data $\hat{Q}_i$ restored in a quaternion space.

On the other hand, in the method for encoding field data using DPCM and entropy encoding, a correlation between successive data is considered, and thus this method is considered more effective than the method for encoding field data using PCM in terms of encoding efficiency. In this method, a differential value between previously restored key value data and key value data to be encoded is calculated before a quantization process, and then the differential value is quantized, thus enhancing the encoding efficiency by taking advantage of the characteristics of data shown in the differential value. FIGS. 2A and 2B are block diagrams of a MPEG-4 PMFC encoder using linear DPCM and entropy encoding, and a MPEG-4 PMFC decoder using inverse linear DPCM and entropy decoding, respectively. A linear DPCM operator shown in FIG. 2A calculates differential data $\dot{Q}_i$ between current key value data and previously restored key value data following Equation (2).

$$Q_i = Q_1 - \hat{Q}_{i-1} = (q_{i,0} - \hat{q}_{i-1,0}, \ q_{i,1} - \hat{q}_{i-1,1}, \ q_{i,2} - \hat{q}_{i-2,2}, \ q_{i,3} - \hat{q}_{i-1,3}) \quad (2)$$

In Equation (2), $Q_i$ represents original key value data at a predetermined moment of time (t), which are represented by a quaternion, and $\hat{Q}_{i-1}$ represents key value data at a predetermined moment of time (t−1), which are restored from an error compensation circuit.

However, the encoding method performed in the apparatus for encoding key value data shown in FIG. 2A does not have a high encoding efficiency. It is possible to easily figure out what the disadvantages of the encoding method are by analyzing key value data, which determine the rotation of an object in a quaternion space. Key value data are represented by a quaternion in the following equation.

$$Q = \left(\cos\frac{\theta}{2}, \frac{n_x}{\|n\|}\sin\frac{\theta}{2}, \frac{n_y}{\|n\|}\sin\frac{\theta}{2}, \frac{n_z}{\|n\|}\sin\frac{\theta}{2}\right) \quad (3)$$

For example, when components of one quaternion have the same absolute values as their corresponding components of another quaternion but different signs in a quaternion space, as shown in Equation (3), the two quaternions are considered the same. In other words, the two quaternions provide the same effects in terms of the rotational transformation of an object in a 3D space, which means the factors that affect the rotational transformation of an object are a direction of a rotation axis and a rotation angle, rather than the vector of the rotation axis. However, like in MPEG-4 BIFS, if key value data are represented by a quaternion using Equation (3) and a differential value is linearly calculated by calculating differences in vectors between successive key value data, the differential value is not 0, which means that linear differential values do not reflect redundancy in rotational transformation well. Accordingly, it is impossible to precisely measure the quality of images using the method for measuring the distortion degree of images shown in Equation (1).

SUMMARY OF THE INVENTION

To solve the above and other problems, it is an aspect of the present invention to provide a method and an apparatus for encoding key value data of an orientation interpolator by calculating a rotational differential value, which can sufficiently reflect redundancy in rotational transformation.

It is another aspect of the present invention to provide a method and an apparatus for decoding encoded key value data by encoding a rotational differential value.

It is another aspect of the present invention to provide a method and an apparatus for generating rotational differential data, which are adopted in the method and the apparatus for encoding key value data according to the present invention.

To achieve the above as well as other aspects of the present invention, there is provided an apparatus for encoding key value data of an orientation interpolator representing rotation transformation of an object in keyframes. The apparatus includes a rotational differential data generator which generates, using a rotational transformation value of a current keyframe and a restored rotational transformation value of a previous keyframe, a rotational differential value used to rotate the object by as much as a difference between rotational transformation applied to the object in the current keyframe by key value data and rotational transformation applied to the object in the previous keyframe by key value data, and outputs rotational differential data by quantizing the rotational differential value, a circular DPCM operator which selectively performs a linear DPCM operation or a circular DPCM operation on rotational differential data, and an entropy encoder which entropy-encodes the rotational differential data.

Preferably, the rotational differential data generator includes a quantizer which generates rotational differential data by quantizing three component values of the rotational differential value, a quantized data adjustor which adjusts three component values of rotational differential data input thereinto, an inverse quantizer which inversely quantizes the adjusted component values, a rotational differential value restorer which restores one component value, which has not been quantized, using the three inversely quantized component values and thus generate a restored rotational differential value, and an error measurement unit which measures an error between a rotational differential value input into the quantizer and the restored rotational differential value and outputs rotational differential data having adjusted component values so that the error can be minimized.

Alternatively, the rotational differential data generator may include a first quaternion multiplier which generates the rotational differential value using the rotational transformation value of the current keyframe and the restored rotational transformation value of the previous keyframe, a quantizer which generates rotational differential data by quantizing the rotational differential value, an inverse quantizer which generates a restored rotational differential value by inversely quantizing the rotational differential data, and a second quaternion multiplier which generates a restored rotational differential value of the current keyframe by quaternion-multiplying the restored rotational differential value by a rotational transformation value of the previous keyframe.

To achieve the above as well as other aspects of the present invention, there is provided a method for encoding key value data of an orientation interpolator representing the rotation of an object in each keyframe. The method includes (a) generating a rotational differential value used to rotate the object by as much as a difference between rotational transformation applied to the object in the current keyframe by key value data and rotational transformation applied to the object in the previous keyframe by key value data using a restored rotational transformation value of the previous keyframe, generating rotational differential data to be entropy-encoded by quantizing the rotational differential value, and selectively performing a linear DPCM operation or a circular DPCM operation on the quantized rotational differential value, and (c) entropy-encoding the rotational differential data.

Preferably, step (a) includes (a1) generating the rotational differential value using a rotational transformation value of the current keyframe and a restored rotational transformation value of the previous keyframe, (a2) generating rotational differential data by quantizing the rotational differential value, (a3) generating a restored rotational differential value by inversely quantizing the rotational differential data, and (a4) generating a restored rotational transformation value of the current keyframe by quaternion-multiplying the restored rotational differential value by a rotational transformation value of the previous keyframe.

Preferably, step (a) includes (a1) generating rotational differential data by quantizing three component values of the rotational differential value, (a2) adjusting three component values of the rotational differential data, (a3) inversely quantizing the adjusted component values, (a4) generating a restored rotational differential value by restoring one component value using the three inversely quantized component values, and (a5) measuring an error between the rotational differential value and the restored rotational differential value and determining rotational differential data having adjusted component values so that the error can be minimized as rotational differential data to be entropy-encoded.

To achieve the above as well as other aspects of the present invention, there is provided an apparatus for decoding a bitstream, into which key value data of an orientation interpolator representing the rotational transformation of an object in keyframes are encoded. The apparatus includes an entropy decoder which generates circular-DPCMed rotational differential data or quantized rotational differential data by entropy-decoding the bitstream, an inverse circular DPCM operator which generates quantized rotational differential data by performing an inverse circular DPCM operation on the rotational differential data input from the entropy decoder depending on the order of DPCM decoded from the bitstream, an inverse quantizer which generates rotational differential data, used to rotate an object by as much as a difference between rotational transformation applied to the object in the current keyframe by key value data and rotational transformation applied to the object in the previous keyframe by key value data, by inversely quantizing quantized rotational differential value, and a quaternion multiplier which generates a rotational transformation value of a current keyframe by quaternion-multiplying a rotational differential value of the current keyframe by a decoded rotational transformation value of a previous keyframe.

To achieve the above as well as other aspects of the present invention, there is provided a method for decoding a bitstream, into which key value data of an orientation interpolator representing the rotation of an object in each keyframe are encoded. The method includes (a) generating circular-DPCMed rotational differential data or quantized rotational differential data by entropy-decoding key value data from the bitstream, (b) generating rotational differential data by performing an inverse circular DPCM operation on the entropy-decoded rotational differential data depending on the order of DPCM decoded from the bitstream, (c) generating a rotational differential value used to rotate the object by as much as a difference between rotation transformations applied to the object by quaternion key value data of each keyframe by inversely quantizing the rotational differential data, and (d) generating a rotational transformation value of a current keyframe by quaternion-multiplying a rotational differential value of the current keyframe by a decoded rotational transformation value of a previous keyframe.

To achieve the above as well as other aspects of the present invention, there is provided a bitstream, into which key value data of an orientation interpolator representing the rotation of an object in each keyframe are encoded. The bitstream includes rotational differential data entropy-encoded by quantizing a rotational differential value used to rotate the object by as much as a difference between rotational transformations applied to the object by quaternion key value data of each of the keyframes, entropy-decoding information which comprises an entropy-decoding mode indicating an entropy-decoding method, which has been performed on the rotational differential data, inverse circular DPCM information which comprises the order of inverse circular DPCM operation indicating whether or not an inverse circular DPCM operation will be performed on rotational differential data entropy-decoded following the entropy-decoding mode, and inverse quantization bits which are used to restore a rotational differential value by inversely quantizing inversely circular-DPCMed rotational differential data following the order of inverse circular DPCM operation.

To achieve the above as well as other aspects of the present invention, there is provided an apparatus for generating rotational differential data, which generates differential data of rotational transformation values representing the rotation of an object in each frame. The apparatus includes a first quaternion multiplier which generates a rotational differential value used to rotate an object by as much as a difference between rotational transformation applied to the object in a current keyframe by a rotational transformation value of the current frame and rotational transformation applied to the object in a previous keyframe by a restored rotational transformation value of the previous frame, a quantization unit which generates rotational differential data by quantizing the rotational differential value, an inverse quantization unit which generates a restored rotational differential value by inversely quantizing the rotational differential data, and a second quaternion multiplier which generates a restored rotational transformation value of the current frame by quaternion-multiplying the restored rotational differential value by a rotational transformation value of the previous frame.

To achieve the above as well as other aspects of the present invention, there is provided a method for generating rotational differential data, which generates differential data of rotational transformation values representing the rotation of an object in each frame. The method includes (a) generating a rotational differential value used to rotate the object by as much as a difference between rotation transformations applied to the object in each of the frames using a rotational transformation value of a current frame and a restored rotational transformation value of a previous frame, (b) generating rotational differential data by quantizing the rotational differential value, (c) generating a restored rotational differential value by inversely quantizing the rotational differential value, and (d) generating a restored rotational transformation value of a current frame by quaternion-multiplying the restored rotational differential value by a rotational transformation value of a previous frame and performing steps (a) through (d) again on the restored rotational transformation value of the current frame and a rotational transformation value of a next frame.

BRIEF DESCRIPTION OF THE DRAWINGS

The above and other aspects and advantages of the present invention will become more apparent by describing in detail preferred embodiments thereof with reference to the attached drawings in which:

FIG. 5C is a diagram illustrating the results of performing a circular DPCM operation on the linear-DPCMed differential data shown in FIG. 5B;

FIG. 6A is a diagram illustrating an example of a function SignedAAC( ) used for entropy encoding.

FIG. 12 is a diagram illustrating the structure of a bitstream input into an entropy decoder;

FIGS. 13A through 13E are diagrams illustrating examples of SDL-language program codes, by which an apparatus for decoding key value data according to the present invention are realized;

DETAILED DESCRIPTION OF THE INVENTION

Hereinafter, the present invention will now be described more fully with reference to the accompanying drawings, in which preferred embodiments of the invention are shown.

Figure 1:
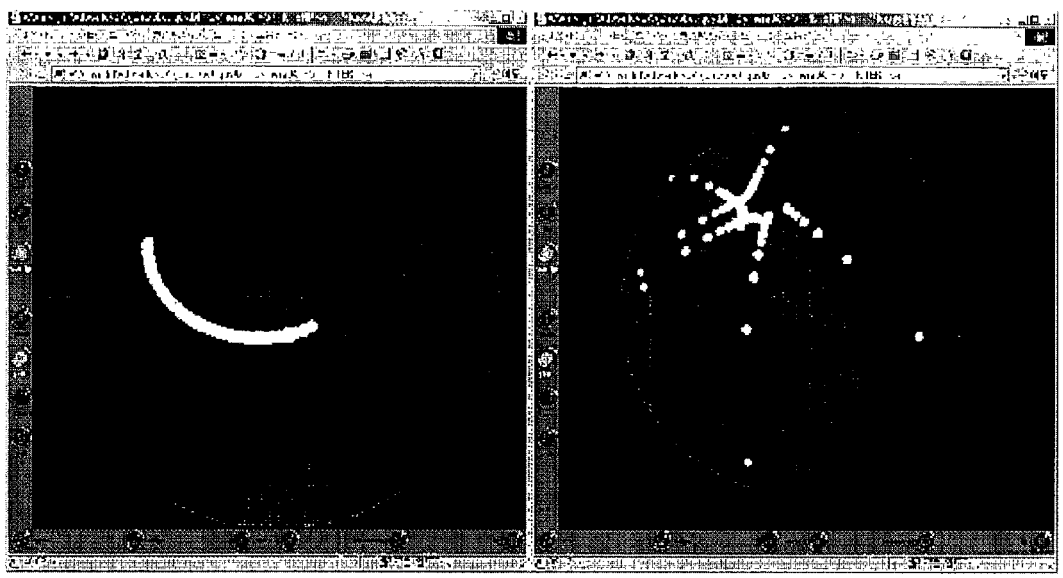
FIG. 1 is a diagram illustrating two-dimensional trajectories of animation data, represented by an orientation interpolator node, in accordance with the passage of time on the surface of a three-dimensional sphere.
Figure 2A:
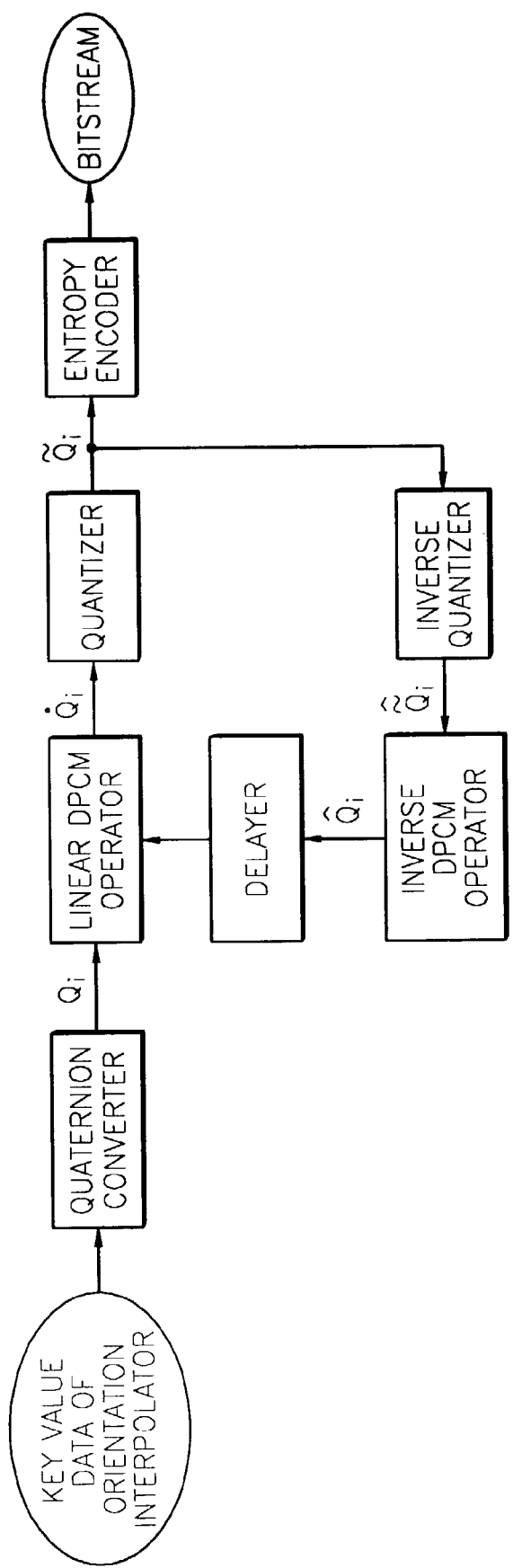
FIGS. 2A and 2B are block diagrams of a MPEG-4 PMFC encoder using linear DPCM and entropy encoding and a MPEG-4 PMFC decoder using inverse linear DPCM and entropy decoding, respectively.
Figure 2B:
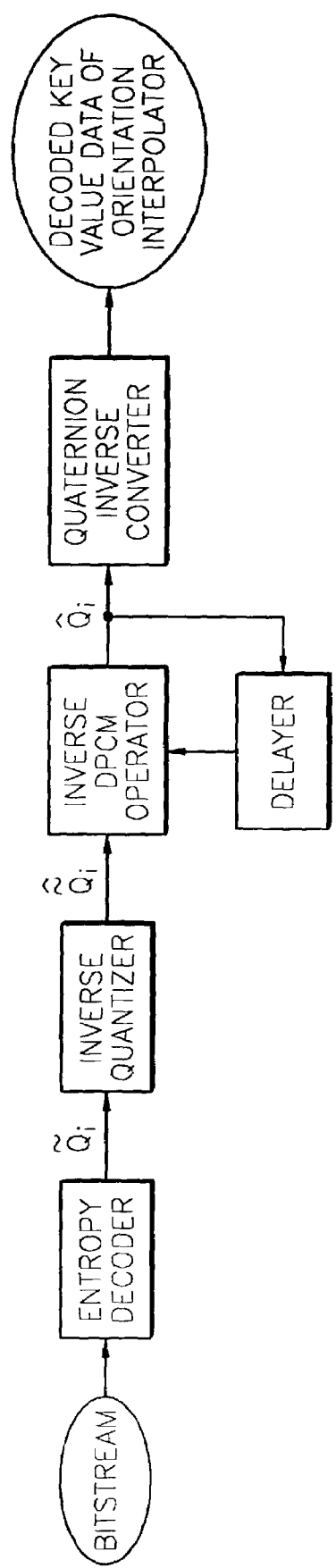
Figure 3A:
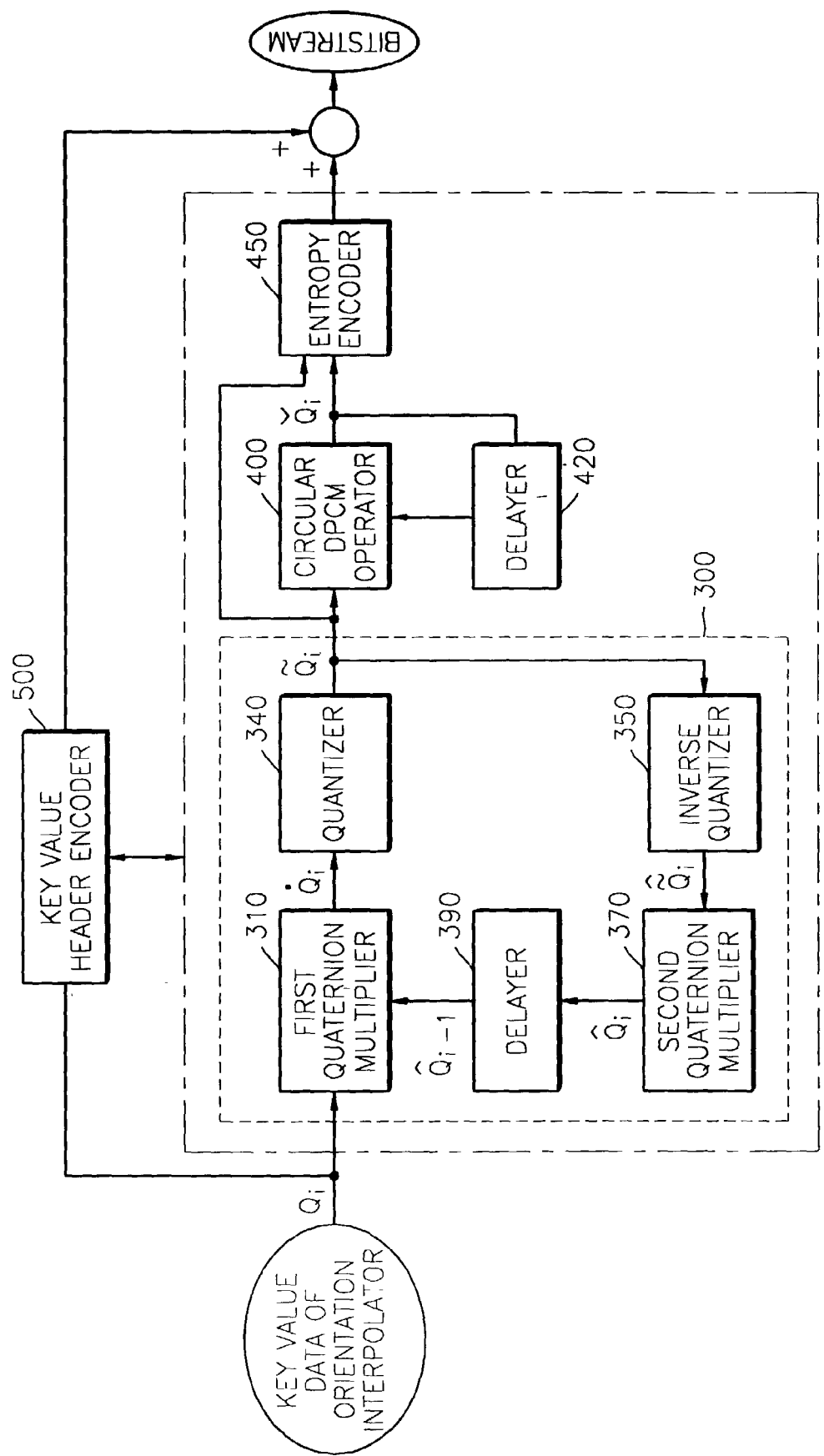
FIG. 3A is a block diagram of an apparatus for encoding key value data according to a first embodiment of the present invention.

FIG. 3A is a block diagram of an apparatus for encoding key value data of an orientation interpolator node according to a first embodiment of the present invention. Referring to FIG. 3A, the apparatus for encoding key value data of an orientation interpolator node according to the first embodiment of the present invention includes a rotational DPCM operator 300, which calculates rotational differential values among rotational transformation values of an object in successive keyframes, which are obtained by applying quaternion key value data of the keyframes to their respective objects, quantizes the rotational differential values, and outputs rotational differential data, a circular DPCM operator 400, which selectively performs a linear DPCM operation and a circular DPCM operation on quantized rotational differential data, an entropy encoder 450, which entropy-encodes rotational-DPCMed or circular-DPCMed rotational differential data, and a key value header encoder 500, which encodes information necessary to decode encoded key value data of an orientation interpolator node.

The rotational DPCM operator 300 includes a first quaternion multiplier 310, which calculates a rotational differential value between a rotational transformation value of an object in a previous keyframe and a rotational transformation value of the object in a current keyframe by quaternion-multiplying the rotational transformation value of the object in the current keyframe by the rotational transformation value of the object in the previous keyframe, a quantizer 340, which generates quantized rotational differential data by non-linearly quantizing the rotational differential value input from the first quaternion multiplier 310, an inverse quantizer 350, which generates restored rotational differential data of the object in the current keyframe by inversely quantizing quantized rotational differential data, a second quaternion multiplier 370, which restores the rotational transformation value of the object in the current keyframe by quaternion-multiplying the rotational differential value of the object in the current keyframe by the rotational transformation values of the object in previous keyframes calculated by accumulating the rotational differential data, and a delayer 390, which outputs the restored rotational transformation value of the object in the current keyframe to the first quaternion multiplier 310 when a rotational transformation value of the object in a next keyframe is input.

Hereinafter, a rotational DPCM operation performed in a rotational DPCM operator according to the present invention will be described in greater detail.

In a linear DPCM method, which has been adopted in conventional MPEG-4 PMFC, a differential value between a quaternion rotational transformation value $Q_1$ ($Q_1=(q_{1,0}, q_{1,1}, q_{1,2}, q_{1,3})$) representing rotational transformation of an object in a current keyframe (or representing the degree to which an object in a current keyframe is rotationally transformed) and a quaternion rotational transformation value $Q_2$ ($Q_2=(q_{2,0}, q_{2,1}, q_{2,2}, q_{2,3})$) representing rotational transformation of the object in a next keyframe is calculated following Equation (4).

$$Q_{LinearDPCM}=(q_{1,0}-q_{2,0},\ q_{1,1}-q_{2,1},\ q_{1,2}-q_{2,2},\ q_{1,3}-q_{2,3}) \quad (4)$$

However, the linear DPCM method only calculates a differential value between quaternion components, which does not reflect any meaningful rotational differential value, i.e., an actual rotational differential value. Accordingly, the linear DPCM method cannot reduce redundancy among successive key value data to be encoded effectively. In addition, in the linear DPCM method, four components of a quaternion except for one component having the greatest value are encoded. Therefore, it is necessary to additionally encode 2-bit long information on the one component, which has not been encoded, and transmit the 2-bit long information to a decoder from an encoder.

In order to solve the above problem with the conventional linear DPCM method by reducing redundancy among successive key value data, the apparatus for encoding key value data according to the first embodiment of the present invention provides a rotational DPCM operation, in which actual rotational differential values are considered.

When $\hat{x}$ represents a reference vector representing a reference position of an object in a current keyframe, $(\hat{n}_{i-1}, \theta_{i-1})$ represents key value data when key data are equal to $k_{i-1}$, and $\hat{y}_{i-1}$ is a displacement vector of $\hat{x}$ obtained by rotationally transforming the object in the current keyframe, rotational transformation in a quaternion space can be expressed by the following equation.

$$Y_{i-1}=Q_{i-1}\times X_0\times Q^*_{i-1} \quad (5)$$

In Equation (5), $X_0$, $Y_{i-1}$, $Q_{i-1}$, and $Q^*_{i-1}$ represent unit quarternions of $\hat{x}$, $\hat{y}_{i-1}$, $(\hat{n}_{i-1}, \theta_{i-1})$, and $(\hat{n}_{i-1}, \theta_{i-1})^*$, respectively. In addition, $Q^*_{i-1}$ represents a quaternion complex conjugate of $Q_{i-1}$, and × represents quaternion multiplication.

In this manner, when key data are equal to $k_i$, rotational transformation in a quaternion space can be expressed by the following equation.

$$Y_i = Q_i \times X_0 \times Q^*_i \quad (6)$$

A rotational differential value among successive rotational transformation values of successive key value data can be calculated following Equation (7).

$$Y_i = Q_i \times X_0 \times Q^*_i = Q_i \times Q^*_{i-1} \times Y_{i-1} \times Q_{i-1} \times Q^*_i = Q_i \times Y_{i-1} \times Q^*_i \quad (7)$$

Accordingly, a rotational differential value can be defined by the following equation, which is derived from Equations (5) and (6).

$$\dot{Q}_i = Q_i \times Q^*_{i-1} \quad (8)$$

In order to prevent a quantization error from affecting a next rotational differential value, the apparatus for encoding key value data according to the first embodiment of the present invention redefines the rotational differential value defined by Equation (8) using a rotational transformation value in a next keyframe and a restored rotational transformation value $\hat{Q}^*_{i-1}$ in a previous keyframe, which is shown in Equation (9).

$$\dot{Q}_i = Q_i \times \hat{Q}^*_{i-1} \quad (9)$$

Figure 3B:
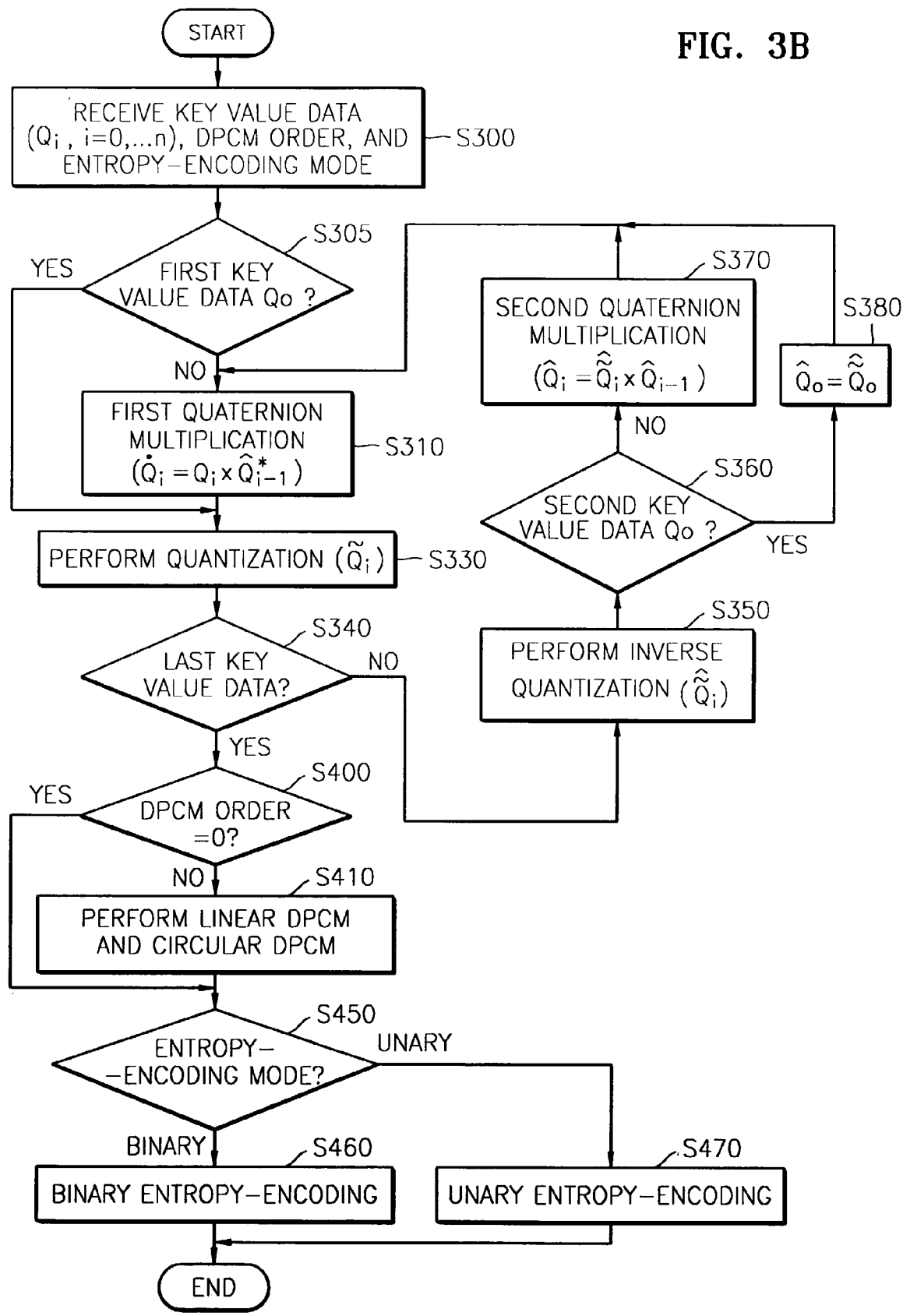
FIG. 3B is a block diagram of an apparatus for decoding key value data according to a first embodiment of the present invention.

Hereinafter, a method for encoding key value data according to a preferred embodiment of the present invention will be described with reference to FIG. 3B. FIG. 3B is a flowchart of a method for encoding key value data according to a preferred embodiment of the present invention.

The apparatus for encoding key value data according to the first embodiment of the present invention receives the order of DPCM, an entropy-encoding mode, and key value data in step S300.

Next, the first quaternion multiplier 310 receives key value data $Q_i$ represented by a quaternion and checks whether or not the input key value data $Q_i$ are first key value data $Q_0$ in step S305. If the input key value data $Q_i$ are the first key value data $Q_0$, it means that there is no accumulated quaternion transformation value used for quaternion multiplication. Accordingly, the first quaternion multiplier 310 outputs the input key value data $Q_i$ to the quantizer 340. If the input key value data $Q_i$ are not the first key value data $Q_0$, the first quaternion multiplier 310 calculates a quaternion differential value $\dot{Q}_i$, which is a differential value between the key value data of the current keyframe and the restored key value data of the previous keyframe, in step S310 by quaternion-multiplying $(Q_i \times \hat{Q}^*_{i-1})$ the restored quaternion transformation value $\hat{Q}^*_{i-1}$ (complex conjugate of $\hat{Q}_{i-1}$) in the previous keyframe by the input key value data $Q_i$ represented by a quaternion transformation value.

The quantizer 340 receives the first key value data $Q_0$ or the quaternion rotational differential value $\dot{Q}_i$ from the first quaternion multiplier 310 and quantizes the input using a predetermined number of quantization bits in step S330.

Since all rotational quaternion differential values are each represented by unit quaternion, a norm of a quaternion representing a rotational differential value is always 1. Therefore, a component among four components of a quaternion, which has not been encoded, can be decoded using the other three components. The apparatus for encoding key value data of an orientation interpolator node according to the first embodiment of the present invention encodes only three components among the four components of a quaternion in order to reduce the amount of data to be encoded. Accordingly, the quantizer 340 quantizes only the three components which will be encoded.

The quantizer 340 according to the present invention performs non-linear quantization rather than general linear quantization, and the reason will be described below with reference to FIG. 4A.

Figure 4A:
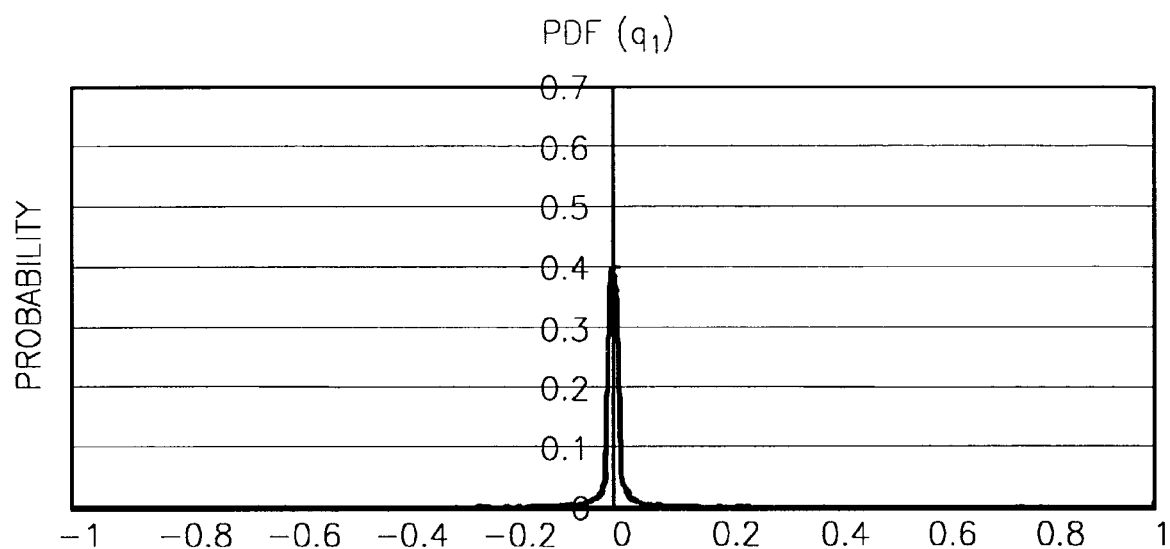
FIG. 4A is a diagram illustrating a typical example of a probability distribution function (PDF) in each component of a rotational differential value.

FIG. 4A is a diagram illustrating a typical example of a probability distribution function (PDF) in each component of a rotational differential value. As shown in FIG. 4A, component values of rotation differential values generally concentrate around 0, which is called energy compaction and means it is possible to reduce redundancy among pieces of rotation information effectively. Accordingly, in order to quantize rotational differential values, reflecting lower component values of each of the rotational differential values more sufficiently, quantization needs to be performed on the lower component values more elaborately, and that is why the quantizer 340 according to the present invention performs non-linear quantization. Here, the quantizer 340 uses an arc-tangent curve in order to allot a non-linear scale factor to each of the rotational differential values.

Figure 4B:
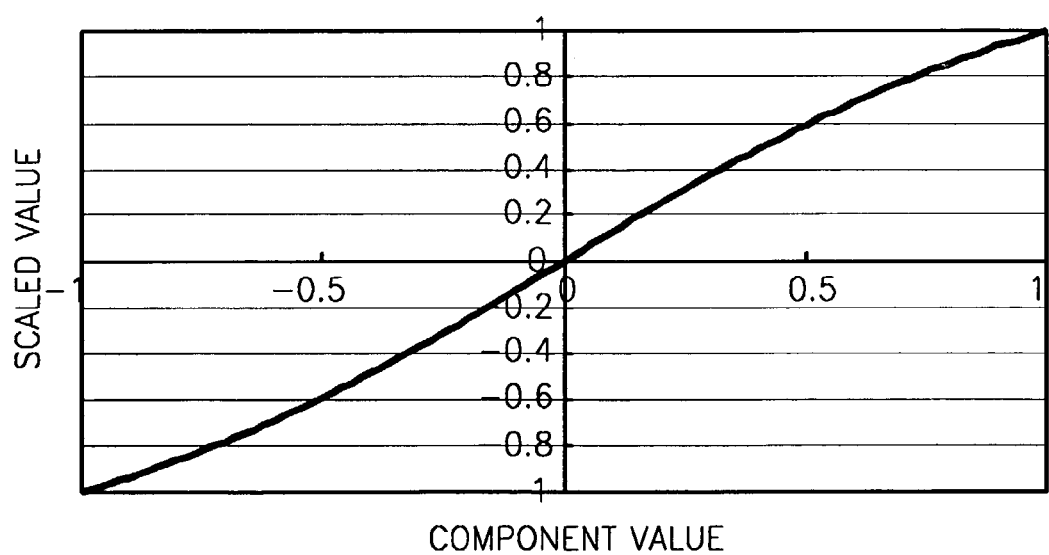
FIG. 4B is an arc-tangent curve for nonlinear quantization.

FIG. 4B is an arc-tangent curve used for quantization according to the present invention. As shown in FIG. 4B, the arc-tangent curve provides an appropriate resolution to higher input values and provides a much higher resolution to lower input values. The quantizer 340 quantizes a rotational differential value in step S330 using a non-linear scale function, which is shown in the following equation.

$$\tilde{q}_i = \text{floor}(q'_i \cdot (2^{nQBits-1} - 1) + 0.5) \quad (q'_i \geq 0) \quad (10)$$
$$= -\text{floor}(-q'_i \cdot (2^{nQBits-1} - 1) + 0.5) \quad (q'_i < 0)$$

$$\left(q'_i = \frac{4}{\pi} \cdot \tan^{-1}(\dot{q}_i), i = 1, 2, 3, -1 \leq \dot{q}_i \leq 1\right)$$

Here, $\dot{q}_i$ represents each component of the rotational differential value input into the quantizer 340, $q_i'$ represents a scaled value of $\dot{q}_i$, nQBits represents a predetermined number of quantization bits used for quantization, and floor(x) represents a function for converting an input value x into a maximum integer of no greater than x.

The quantizer 340 performs quantization on the input rotational differential value and then checks whether or not the quantized rotational differential data correspond to last key value data to be encoded. If the quantized rotational differential data correspond to the last key value data, the quantizer 340 outputs the quantized rotational differential data to the circular DPCM operator 400. If the quantized rotational differential data do not correspond to the last key value data, the quantizer 340 outputs the quantized rotational differential data to the inverse quantizer 350.

In step S340, the inverse quantizer 350 inversely quantizes the quantized rotational differential data input from the quantizer 340 and outputs a restored rotational differential value in step S350.

Figure 11A:
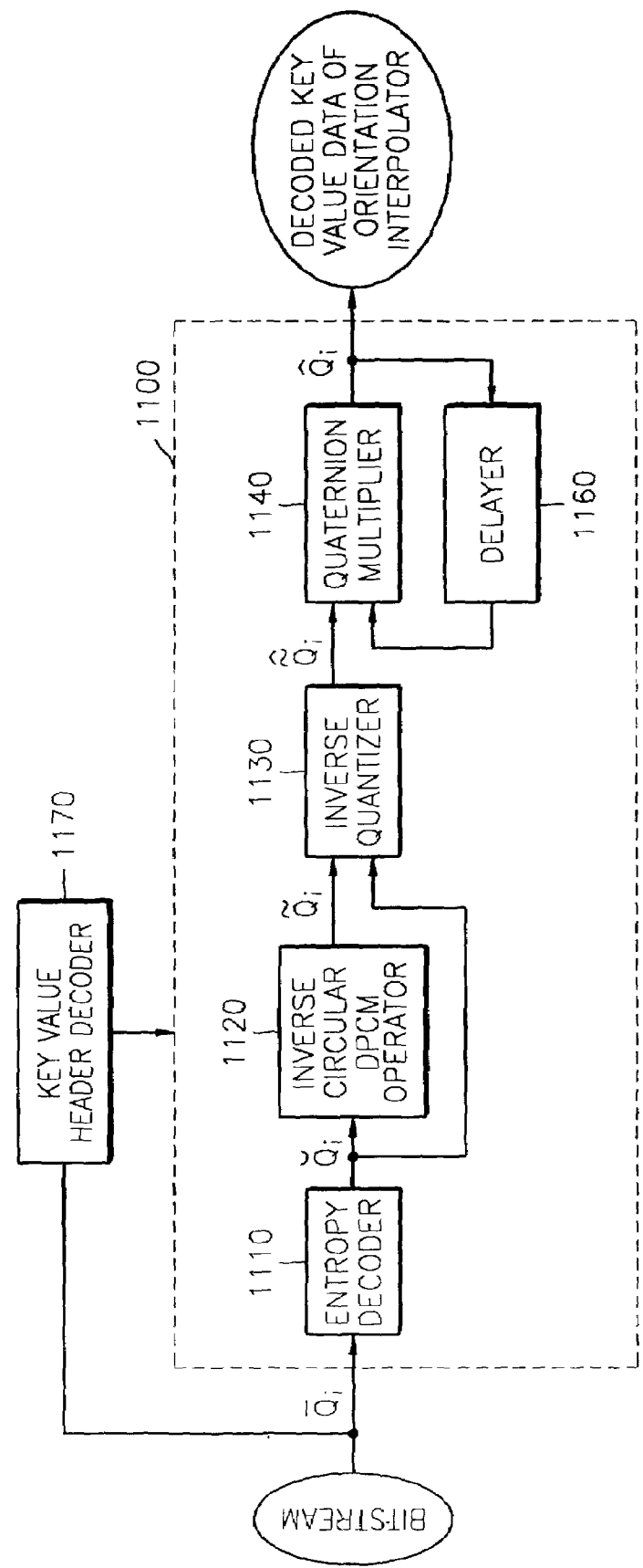
FIG. 11A is a block diagram of an apparatus for decoding key value data of an orientation interpolator according to a preferred embodiment of the present invention.

As described above, the apparatus for encoding key value data according to the first embodiment of the present invention encodes only three components of a quaternion representing a rotational differential value by quantizing the three components other than the first component. An inverse quantizer 1130 of an apparatus for decoding key value data, which is shown in FIG. 11A, and the inverse quantizer 350, which has been described above, are supposed to restore the other one, which has not been encoded, among the four components of the rotational differential value, using the three encoded components. Since all rotational differential values are each represented by a unit quaternion, the norm of a quaternion representing a rotational differential value is always 1. Therefore, it is possible to restore the first component among the four components of the rotational differential value using the following equation.

$$\hat{q}_0 = \sqrt{1 - (\hat{q}_1^2 + \hat{q}_2^2 + \hat{q}_3^2)} \; (\hat{q}_0 \geq 0) \quad (11)$$

In Equation (11), $\hat{q}_1$, $\hat{q}_2$, and $\hat{q}_3$ represent three restored components of a rotational differential value, and $\hat{q}_0$ represents a first component restored using the three restored components $\hat{q}_1$, $\hat{q}_2$, and $\hat{q}_3$.

In order to restore the first component $\hat{q}_0$ following Equation (11), the first component $\hat{q}_0$ must have a positive value, and this condition can be satisfied by taking advantage of the characteristics of a quaternion, which appear when applying a quaternion to rotational transformation of an object in a 3D space and are shown in Equation (12).

$$Y = Q \times X \times Q^* = (-Q) \times X \times (-Q)^* \quad (12)$$

Equation (12) shows that rotational transformation values Q and −Q are the same in terms of their functions when applying rotational transformation to an object in a 3D space. Accordingly, if the first component of a rotational differential value in the apparatus for encoding key value data according to the first embodiment of the present invention has a negative value, the rotational differential value can be easily converted into a positive number by multiplying each of the components of the rotational differential value by −1. In this case, however, the sum of the square of each of the components of a restored rotational differential value except for the first component may exceed 1 due to a quantization error. In this case, $\hat{q}_0$ cannot be determined by Equation (11) and is considered a value which is close to 0 and is smaller than a minimum value which can be quantized by the quantizer 340. The fact that $\hat{q}_0$ has such a value means that the object has been rotationally transformed by as much as about 180 degrees. Accordingly, an apparatus for decoding key value data needs a method for determining $\hat{q}_0$ while minimizing the effect of the restored first component value $\hat{q}_0$ on the three restored component values $\hat{q}_1$, $\hat{q}_2$, and $\hat{q}_3$, and the method will be also applied to the inverse quantizer 350 of the apparatus for encoding key value data according to the first embodiment of the present invention. For example, the minimum value which can be quantized by the quantizer 340 and the minimum value multiplied by a predetermined integer may be determined as $\hat{q}_0$. The following equation may be used to determine $\hat{q}_0$.

$$\hat{q}_0 = \alpha \cdot 2^{-m} \quad (13)$$

In Equation (13), 'a' represents an arbitrary constant, and m represents a predetermined number of quantization bits.

While 2-bit long information on each key value data is required for decoding in the conventional MPEG-4 BIFS PMFC method, the 2-bit long information is not necessary in the present invention, and thus the number of bits to be encoded can be decreased by as much as 2N when encoding N key value data.

The restored rotational differential value output from the inverse quantizer 350 is input into the second quaternion multiplier 370, and the second quaternion multiplier 370 checks if an input keyframe is a first keyframe to be encoded in step S360. If the input keyframe is the first keyframe to be encoded, the second quaternion multiplier 370 accumulates the restored rotational transformation value of the first keyframe input from the inverse quantizer 350 ($\hat{Q}_0 = \tilde{Q}_0$) and outputs the accumulated value to the delayer 390 in step S380.

If the input keyframe is the first keyframe to be encoded, the second quaternion multiplier 370 restores a rotational transformation value $\hat{Q}_i$ of a current keyframe in step S370 by quaternion-multiplying a rotational differential value $\tilde{Q}_i$ of the current keyframe and a restored rotational transformation value $\hat{Q}_{i-1}$ of a previous keyframe ($\hat{Q}_i = \tilde{Q}_i \times \hat{Q}_{i-1}$).

The second quaternion multiplier 370 outputs the restored rotational transformation value $\hat{Q}_i$ of the current keyframe to the delayer 390, and then the delayer 390 keeps $\hat{Q}_i$ until a rotational transformation value of a next keyframe is input so that $\hat{Q}_{i-1}$ can be the same as $\hat{Q}_{i-1}$ and then outputs $\hat{Q}_{i-1}$ to the first quaternion multiplier 310.

When a rotational transformation value $Q_i$ of a current keyframe is input into the first quaternion multiplier 310, the first quaternion multiplier 310 also receives the restored rotational transformation value $\hat{Q}_{i-1}$ of a previous keyframe from the delayer 390 and generates a rotational differential value $\dot{Q}_i$ between the rotational transformation value of the current keyframe and the restored rotational transformation value of the previous keyframe in step S310 by quaternion-multiplying the restored quaternion transformation value $\hat{Q}^*_{i-1}$ in the previous keyframe by $Q_i$. ($Q_i \times \hat{Q}^*_{i-1}$).

The generated rotational differential value is output to the quantizer 340 and then is quantized by the quantizer 340 in step S330, as described above. The quantizer 340 outputs rotational differential data generated by quantizing a rotational differential value to the circular DPCM operator 400 in step S340 if the input rotational differential value correspond to the last key value data.

The circular DPCM operator 400 checks if the order of DPCM of the quantized rotational differential data input from the quantizer 340 is 0. If the order of DPCM is 0, the circular DPCM operator 400 outputs the quantized rotational differential data to the entropy encoder 450 in step S400 without performing a linear DPCM operation and a circular DPCM operation. If the order of DPCM is not 0, the circular DPCM operator 400 performs a linear DPCM operation and a circular DPCM operation on the quantized rotational differential data in step S410.

Figure 5A:
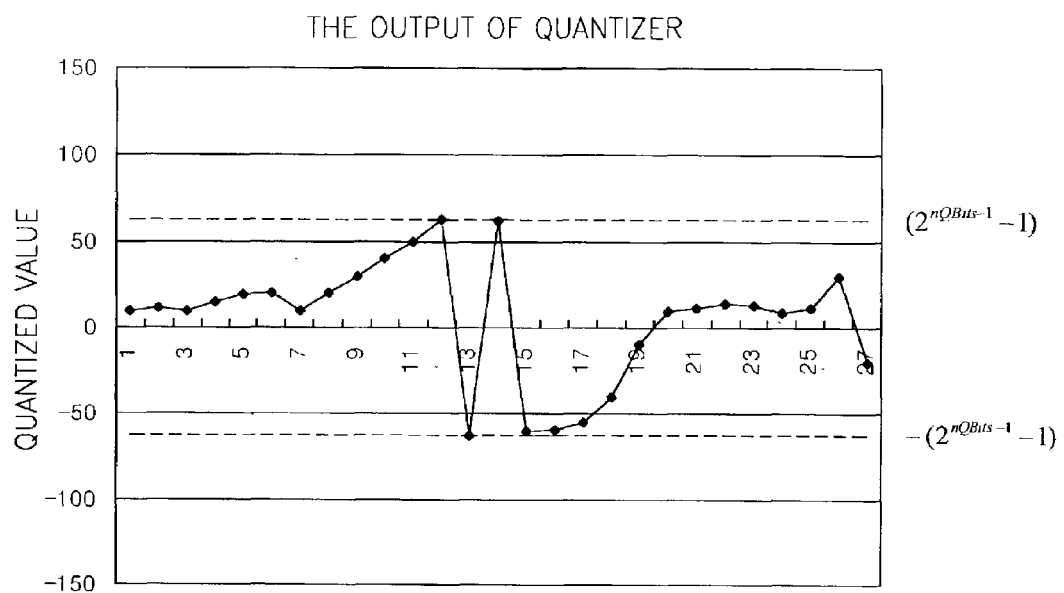
FIG. 5A is an example of rotational differential data output from a quantizer according to a preferred embodiment of the present invention.
Figure 5B:
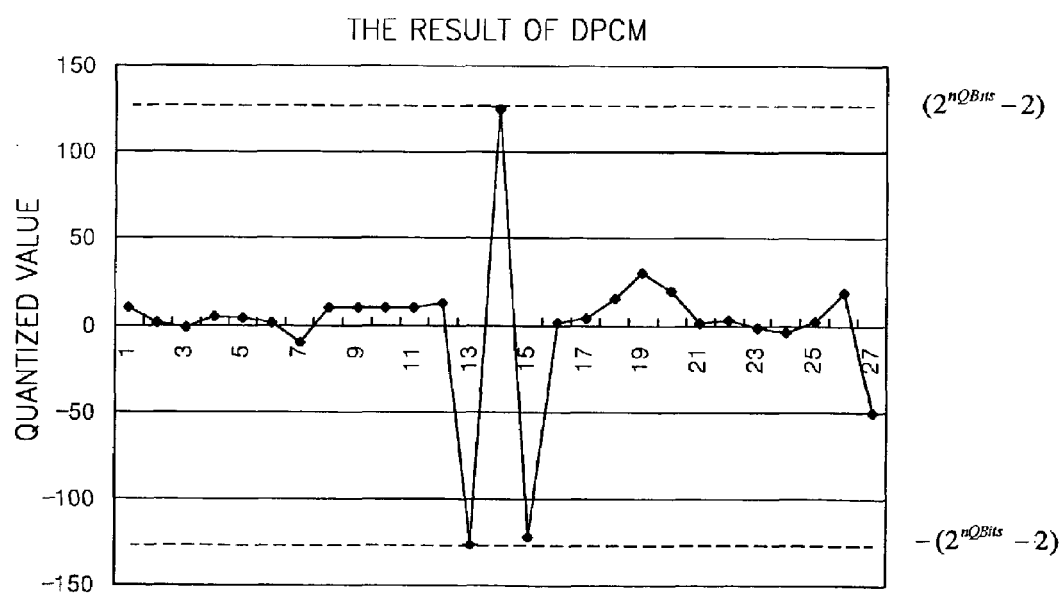
FIG. 5B is a diagram illustrating the results of performing a linear DPCM operation on the differential data shown in FIG. 5A.

FIG. 5A is a diagram illustrating an example of differential data output from the quantizer 340, and FIG. 5B is a diagram illustrating the results of performing a linear DPCM operation on the differential data output from the quantizer 340.

As shown in FIG. 5B, as a result of a linear DPCM operation, the range of differential data to be encoded can be increased two times larger than it used to be. The purpose of the performance of the circular DPCM operation is to maintain the range of differential data within the range of quantized differential data.

The circular DPCM operation is performed on the assumption that a maximum value and a minimum value in a quantization range are circularly connected to each other. Accordingly, if differential data, which are the results of performing linear DPCM on two consecutive quantized data, are greater than half of the maximum value in the quantization range, they can be represented by smaller values by subtracting the maximum value from the differential data.

If the differential data are smaller than half of the minimum value in the quantization range, they can be represented by smaller values even more by adding the maximum value in the quantization range to the differential data.

When $\tilde{Q}_i$ and $\tilde{Q}_{i-1}$ represent quantized rotational differential data at two successive moments of time $t_i$ and $t_{i-1}$, respectively, a linear DPCM operation is performed on the two successive quantized rotational differential data $\tilde{Q}_i$ and $\tilde{Q}_{i-1}$ following Equation (14).

$$X_i = \tilde{Q}_i - \tilde{Q}_{i-1} = (\tilde{q}_{i,1} - \tilde{q}_{i-1,1}, \tilde{q}_{i,2} - \tilde{q}_{i-1,2}, \tilde{q}_{i,3} - \tilde{q}_{i-1,3})^T \quad (14)$$

In addition, a circular DPCM operation is performed on the differential data obtained following Equation (14), following Equation (15).

$$\check{Q}_i = \min(|X_i|, |X'_i|) \quad (15)$$

$$X'_i = X_i - (2^{nQBits} - 1) \text{ (if } X_i \geq 0)$$

$$X'_i = X_i + (2^{nQBits} - 1) \text{ (otherwise)}$$

In Equation (15), nQBits represents a predetermined number of quantization bits. FIG. 5C is a diagram illustrating the results of performing a circular DPCM operation on the DPCMed differential data shown in FIG. 5B. As shown in FIG. 5C, the range of the circular-DPCMed differential data is much smaller than the range of the linear-DPCMed differential data.

The entropy encoder 450 receives the rotational differential data or the circular-DPCMed rotational differential data from the circular DPCM operator 400 depending on the order of DPCM of the rotational differential data and then encodes the input differential data by removing bit redundancy.

Referring to FIG. 3B again, the entropy encoder 450 checks an entropy encoding mode in step S450.

If the entropy encoding mode is a binary entropy encoding mode, the entropy encoder 450 encodes the input differential data using a function SignedAAC( ) in step S460. If the entropy encoding mode is a unary entropy encoding mode, the entropy encoder 450 encodes the input differential data using a function UnaryAAC( ) in step S470.

The function SignedAAC( ) is used to encode differential data using an adaptive binary arithmetic encoder, which encodes the sign and magnitude of the differential data on each bit plane.

FIG. 6A is a diagram illustrating an example of the function SignedAAC( ). Referring to FIG. 6A, when an input value is 74 and the number of bits required for encoding the input value is 8, the sign of the input value is 0 and a binary number representing the input number is 1001010. Signs and all bit planes are encoded in the following way:

First step: a binary number is encoded on every bit plane in an order of from its most significant bit (MSB) to its least significant bit (LSB);

Second step: it is checked if the bit, which is currently being encoded, is 0;

Third step: if the bit currently being encoded is not 0, the sign of the binary number is encoded next; and Fourth step: the remaining bits of the binary number are encoded.

The function Unary AAC( ) converts a value to be encoded into a predetermined number of bits, which consist of a series of 0s, a flag bit 1 indicating that the series of zeros end, and one bit representing the sign of the value. Here, the number of zeros corresponds to the magnitude of the value.

Figure 6B:
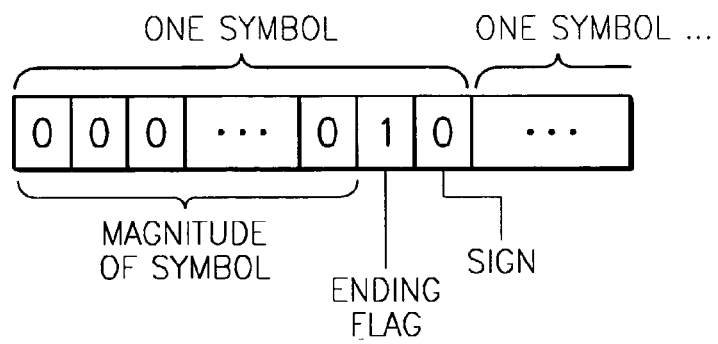
FIG. 6B is a diagram illustrating an example of a function UnaryAAC( ) used for entropy encoding.

The function Unary AAC( ) will be described more fully in the following with reference to FIG. 6B. For example, 256 is encoded into a series of bits consisting of two hundred fifty six 0s, 1 which is a flag bit indicating the series of 0s ends, and 0 which represents the sign of 256, i.e., a plus sign by the function Unary AAC( ). Due to Unary AAC( ), redundancy among the bits representing the symbol to be encoded increases, which enhances the efficiency of encoding the symbol.

Hereinafter, an apparatus for encoding key value data according to a second embodiment of the present invention will be described. The apparatus for encoding key value data according to the second embodiment of the present invention includes a means for correcting a rotation direction error occurring during quantization as well as all the elements of the apparatus for encoding key value data according to the first embodiment of the present invention.

Figure 7:
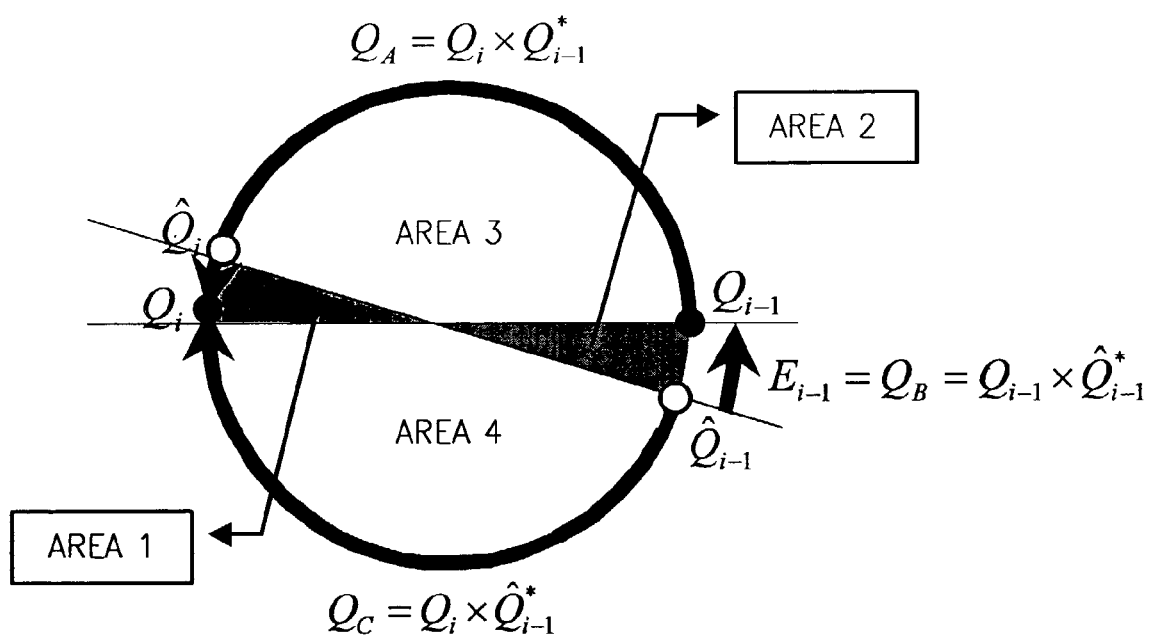
FIG. 7 is a diagram illustrating a rotation direction error occurring during encoding quaternion rotational transformation values using a rotational differential value.

FIG. 7 is a diagram illustrating a rotation direction error generated during encoding quaternion rotational transformation values using rotational differential values. The rotation direction error occurs because the quaternion encoding method performed in the apparatus for encoding key value data according to the present invention is a loss encoding method.

In FIG. 7, when $Q_i$, $Q_{i-1}$, $\hat{Q}_i$, and $\hat{Q}_{i-1}$ represent a rotational transformation value currently being applied to an object in an i-th keyframe, a rotational transformation value applied to the object in a previous keyframe, a value restored from $Q_i$, and a value restored from $Q_{i-1}$, respectively, the locations of the object rotated by rotational transformations respectively applied by $Q_i$, $Q_{i-1}$, $\hat{Q}_i$, and $\hat{Q}_{i-1}$ may be represented by four different areas, as shown in FIG. 7.

In other words, if the object rotates from $Q_{i-1}$ to $Q_i$ along a shortest arc so that the object is located in area 1 and area 3 after rotating by $Q_i$ and $Q_{i-1}$, the object is considered to have rotated from $Q_{i-1}$ to $Q_i$ counterclockwise. Meanwhile, if the object rotates from $Q_{i-1}$ to $Q_i$ along a shortest way so that the object is located in area 2 and area 4 after rotating by $Q_{i-1}$ and $Q_i$, the object is considered to have rotated from $Q_{i-1}$ to $Q_i$ clockwise.

On the other hand, if the object rotates following rotation information which has been encoded and then decoded, an apparatus for decoding key value data rotates the object using $\hat{Q}_i$ and $\hat{Q}_{i-1}$ corresponding to $Q_i$ and $Q_{i-1}$, respectively. Accordingly, if the relative location of the object rotated by $\hat{Q}_i$ with respect to the location of the object rotated by $\hat{Q}_{i-1}$ is area 2 or 3 $\hat{Q}_{i-1}$, the object rotates counterclockwise. If the relative location of the object rotated by $\hat{Q}_i$ with respect to the location of the object rotated by $\hat{Q}_{i-1}$ is area 1 or 4, the object rotates clockwise. In areas 1 and 2, the rotation direction of the object when using an original rotational transformation value may be opposite to the rotation direction of the object when using a decoded rotational transformation value, because $Q_i$ and $\hat{Q}_i$ are different due to loss encoding, which is performed to encode quaternion rotational transformation values. In order to solve this problem, it is required to minimize the degree to which the object rotates in a wrong direction, which is opposite to a desired direction, or to correct the rotation direction of the object when the object rotates in a wrong direction so that the object rotate in a desired direction. In the present invention, the method for correcting the rotation direction of the object so as to make the object rotate in a desired direction is adopted.

Referring to FIG. 7 again, the concept of correction of a rotation direction error according to the present invention will be described briefly in the following. If a rotation direction error, like the phenomenon occurring in areas 1 and 2, is detected, quaternion rotational differential values to be encoded are controlled so as to rotate in a right direction, in which case the inconsistency in rotation directions still occurs in area 2. However, in area 2, unlike in area 1, differences between original quaternion values and restored quaternion values are relatively small. Accordingly, rotation direction correction according to the second embodiment of the present invention is performed on only area 1.

Hereinafter, the apparatus for encoding key value data, which performs rotation direction correction, according to the second embodiment of the present invention will be described with reference to FIGS. 8A through 9B. The apparatus for encoding key value data according to the second embodiment of the present invention has almost the same structure as the apparatus for encoding key value data according to the first embodiment of the present invention. The only difference between them is the structure of a rotational DPCM operator, and thus only the structure of a rotational DPCM operator in the apparatus for encoding key value data according to the second embodiment of the present invention will described in the following.

Figure 8A:
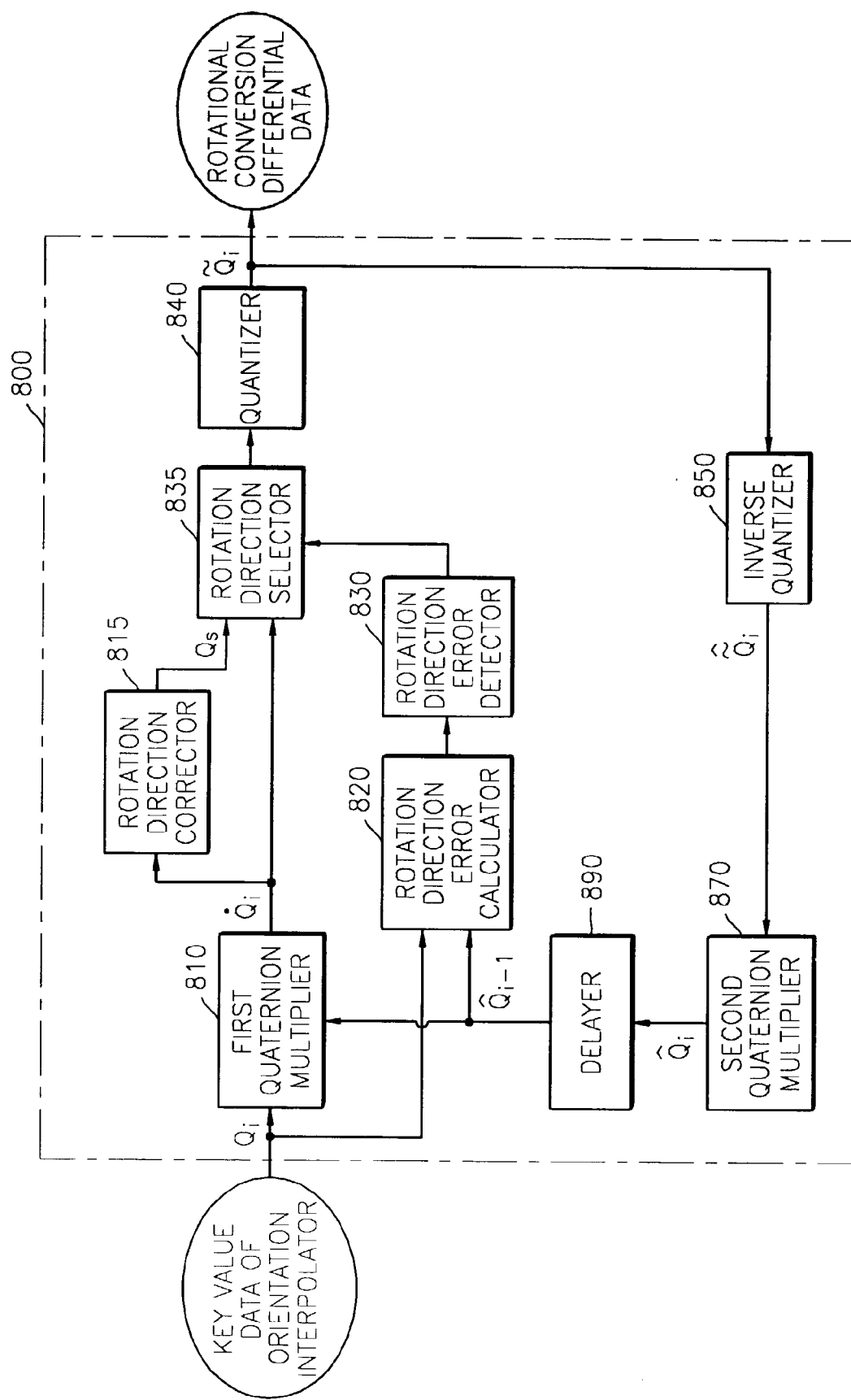
FIG. 8A is a block diagram of a circular DPCM operator according to a second embodiment of the present invention.
Figure 8B:
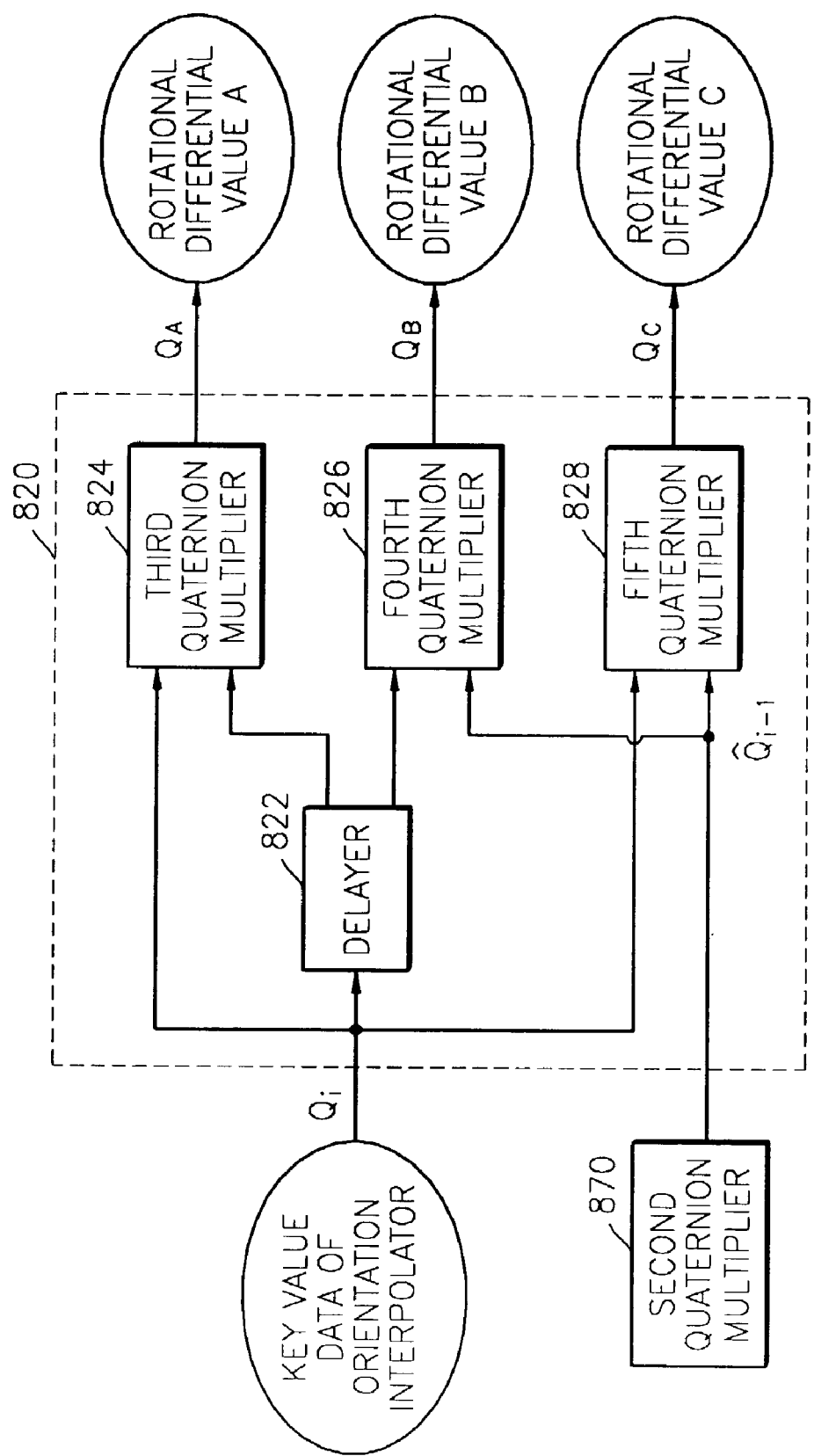
FIG. 8B is a block diagram of a rotation direction error calculator shown in FIG. 8A.

FIG. 8A is a block diagram of a rotational DPCM operator 800 according to the second embodiment of the present invention, and FIG. 8B is a block diagram of a rotation direction error calculator 820 shown in FIG. 8A.

Referring to FIG. 8A, the rotational DPCM operator 800 includes a rotation direction error calculator 820, which receives a rotational transformation value of an object in a current keyframe and a restored rotational transformation value of the object in a previous keyframe and calculates rotation direction errors, a rotation direction error detector 830, which detects based on the rotation direction errors input from the rotation direction error calculator 820 whether or not an error sufficient to change the rotation direction of the object has occurred during decoding, a rotation direction corrector 815, which corrects and outputs a rotational differential value input from the first quaternion multiplier 810 so that the object, which is located already rotated following a decoded rotational transformation value of the previous keyframe, can rotate further by as much as 180 degrees in an original rotation direction, and a rotation direction selector 835, which selects the rotational differential value input from the rotation direction corrector 815 or the rotational differential value input from the first quaternion multiplier 810 depending on a value input from the rotation direction error detector 830 and outputs the selected value to the quantizer 840.

Referring to FIG. 8B, the rotation direction error calculator 820 shown in FIG. 8A includes a delayer 822, which stores an input rotational transformation value until a rotational transformation value of a next keyframe is input, a third quaternion multiplier 824, which receives the input rotational transformation value and a rotational transformation value of a previous keyframe output from the delayer 822 and calculates a rotational differential value between the input rotational transformation value and the rotational transformation value of the previous keyframe by quaternion multiplication, a fourth quaternion multiplier 826, which calculates a rotational differential value between the rotational transformation value of the previous keyframe output from the delayer 822 and the restored rotational transformation value of the previous keyframe, and a fifth quaternion multiplier 828, which calculates between the input rotational transformation value and the restored rotational transformation value of the previous keyframe.

Hereinafter, a rotational DPCM operation according to a second embodiment of the present invention will be described in greater detail with reference to FIG. 9A.

Key value data $Q_i$ of an orientation interpolator node, which are about to be encoded, are input into the first quaternion multiplier 810 and the rotation direction error calculator 820 of the rotational DPCM operator 800 in step S900.

The first quaternion multiplier 810, like the first quaternion multiplier in the apparatus for encoding key value data according to the first embodiment of the present invention, generates a rotational differential value $\dot{Q}_i$ by quaternion-multiplying $(Q_i \times \hat{Q}^*_{i-1})$ an input rotational transformation value of a current keyframe by a restored rotational transformation value of a previous keyframe input from the second quaternion multiplier 870 and outputs the generated rotational differential value $\dot{Q}_i$ to the rotation direction corrector 815 and the rotation direction selector 835 in step S910.

The rotation direction corrector 815 corrects a rotational differential value input thereinto following Equation (16) and outputs the corrected rotational differential value $Q_s$ to the rotation direction selector 835. The rotation direction error calculator 820 receives the rotational transformation value $Q_i$ of the current keyframe and the restored rotational transformation value $\hat{Q}_{i-1}$ of the previous keyframe input from the second quaternion multiplier 870 and calculates rotational transformation values $Q_A$, $Q_B$, and $Q_C$, which will be described later. The rotation direction error detector 830 detects using the rotational differential value input from the rotation direction error calculator 820 whether or not a rotation direction error has occurred and outputs the result of the detection to the rotation direction selector 835 in step S920.

$$Q_s = \begin{pmatrix} -\dfrac{1}{\sqrt{(\dot{q}_{R,1})^2 + (\dot{q}_{R,2})^2 + (\dot{q}_{R,3})^2}} \dot{q}_{R,1} \\ -\dfrac{1}{\sqrt{(\dot{q}_{R,1})^2 + (\dot{q}_{R,2})^2 + (\dot{q}_{R,3})^2}} \dot{q}_{R,2} \\ -\dfrac{1}{\sqrt{(\dot{q}_{R,1})^2 + (\dot{q}_{R,2})^2 + (\dot{q}_{R,3})^2}} \dot{q}_{R,3} \end{pmatrix} \quad (16)$$

In Equation (16), $\delta_T$ represents a constant very close to 0, and $(\dot{q}_{R,0}, \dot{q}_{R,1}, \dot{q}_{R,2}, \dot{q}_{R,3})^T$ represents the rotational differential value $\dot{Q}_i$ output from the first quaternion multiplier 810. The rotation direction error calculator 820, the rotation direction error detector 830, and the rotation direction corrector 815 will be described later with reference to FIG. 9B.

The rotation direction selector 835 checks whether or not a rotation direction error has occurred so that the object rotates in the opposite direction to a desired direction when decoding an encoded key value data using a logic value input from the rotation direction error detector 830. If a rotation direction error has not occurred, the rotation direction selector 835 outputs the rotation differential value input from the first quaternion multiplier 810 to the quantizer 840 in step S930. If a rotation direction error has occurred, the rotation direction selector 835 outputs the corrected rotational differential value input from the rotation direction corrector 815 in step S930.

The quantizer 840 quantizes the original rotational differential data $\dot{Q}_i$ or the corrected rotational differential data $Q_s$ in steps S940 and 950 in the same quantization method as in the first embodiment of the present invention.

The quantizer 840 checks whether or not quantized rotational differential data $\tilde{Q}_i$ belong to the last key value data in step S960. If the quantized rotational differential data $\tilde{Q}_i$ correspond to the last key value data, the quantizer 840 outputs the quantized rotational differential data $\tilde{Q}_i$ to a circular DPCM operator 400 in step S970. If the quantized rotational differential data $\tilde{Q}_i$ do not correspond to the last key value data, the quantizer 840 outputs the quantized rotational differential data $\tilde{Q}_i$ to the inverse quantizer 850.

The inverse quantizer 850 inversely quantizes the quantized rotational differential data $\tilde{Q}_i$ in the same inverse quantization method as in the first embodiment of the present invention and outputs restored rotational differential data $\hat{Q}_i$ to the second quaternion multiplier 870 in step S980.

The second quaternion multiplier 870 generates a restored rotational conersion value $\hat{Q}_i$ of a current keyframe by quaternion-multiplying the restored rotational differential value $\hat{Q}_i$ by a rotational transformation value $\hat{Q}_{i-1}$ of a previous keyframe. The second quaternion multiplier 870 outputs a rotational transformation value of a current keyframe to the first quaternion multiplier 810 and the rotation direction error calculator 820 via the delayer 890 in step S990.

Hereinafter, the operations of the rotation direction error calculator 820, the rotation direction error detector 830, and the rotation direction corrector 815 will be described with reference to FIG. 9B.

The rotation direction error calculator 820 calculates rotational differential values corresponding to areas 2 through 4, which have been described above with reference to FIG. 7.

The rotation direction error calculator 820 receives a rotation transformation value, which corresponds to key value data of a keyframe to be encoded, receives a restored rotational transformation value of a previous keyframe prior to the current keyframe, and calculates a rotation direction error in step S922.

The rotational transformation value corresponding to the key value data of an orientation interpolator of the current keyframe are directly input into the third quaternion multiplier 824 and the fifth quaternion multiplier 828 and are input into the fourth quaternion multiplier 826 via the delayer 822 when a rotational transformation value of a next keyframe is input. In addition, the restored rotational transformation value of the previous keyframe output from the second quaternion multiplier 870 is input into the fourth quaternion multiplier 826 and the fifth quaternion multiplier 828.

The third quaternion multiplier 824 generates the rotational differential value $Q_A$ by quaternion-multiplying $(Q_A=Q_i \times Q^*_{i-1})$ the rotational transformation value of the current keyframe by the rotational transformation value of the previous keyframe and outputs $Q_A$ to the rotation direction error detector 830. The rotational differential value $Q_A$ represents an original rotation direction of an object during a time interval $[t_{i-1}, t_i]$.

The fourth quaternion multiplier 826 generates the rotational differential value $Q_B$ by quaternion-multiplying $(Q_B=Q_{i-1} \times \hat{Q}^*_{i-1})$ the rotational transformation value of the previous keyframe by the restored rotational transformation value of the previous keyframe and outputs $Q_B$ to the rotation direction error detector 830. The rotational differential value $Q_B$ calculated by the fourth quaternion multiplier 826 represents the rotation direction error and rotation direction of an object, which are affected by a quantization error, at a predetermined moment of time $t_{i-1}$ and corresponds to area 2 shown in FIG. 7.

The fifth quaternion multiplier 828 generates the rotational differential value $Q_C$ by quaternion-multiplying $(Q_C=Q_i \times \hat{Q}^*_{i-1})$ the rotational transformation value of the current keyframe by the restored rotational transformation value of the previous keyframe and outputs $Q_C$ to the rotation direction error detector 830. The rotational differential value $Q_C$ calculated by the fifth quaternion multiplier 828 represents a rotational differential value to be encoded at the predetermined moment of time $t_i$ and corresponds to area 4 shown in FIG. 7.

The rotation direction error detector 830 checks using the rotational differential values $Q_A$, $Q_B$, and $Q_C$ input from the rotation direction error calculator 820 whether or not the object rotates in an opposition direction to an original direction in the process of decoding encoded key value data in step S924. For doing this, the rotation direction error detector 830 checks whether or not the rotational differential values $Q_A$, $Q_B$, and $Q_C$ satisfy Inequalities (17) through (21). First of all, the rotation direction error detector 830 checks if the rotational differential values $Q_A$ and $Q_C$ satisfy Inequality (17).

$$\begin{pmatrix} q_{A,1} \\ q_{A,2} \\ q_{A,3} \end{pmatrix} \cdot \begin{pmatrix} q_{C,1} \\ q_{C,2} \\ q_{C,3} \end{pmatrix} < 0 \qquad (17)$$

In Inequality (17), when the rotational differential value $Q_A$ input from the rotation direction error calculator 820 is expressed by $Q_A=(q_{A,0}, q_{A,1}, q_{A,2}, q_{A,3})^T$, $$\begin{pmatrix} q_{A,1} \\ q_{A,2} \\ q_{A,3} \end{pmatrix}$$

represents a three-dimensional vector $(q_{A,1}, q_{A,2}, q_{A,3})^T$ consisting of the four components $q_{A,0}, q_{A,1}, q_{A,2}$, and $q_{A,3}$ of $Q_A$ except for the first component $q_{A,0}$.

$$\begin{pmatrix} q_{C,1} \\ q_{C,2} \\ q_{C,3} \end{pmatrix}$$

represents a three-dimensional vector $(q_{C,1}, q_{C,2}, q_{C,3})^T$ consisting of the four components $q_{C,0}, q_{C,1}, q_{C,2}$, and $q_{C,3}$ of $Q_C$ except for the first component $q_{C,0}$. Inequality (17) shows a condition that a inner product of the two 3D vectors $(q_{A,1}, q_{A,2}, q_{A,3})^T$ and $(q_{C,1}, q_{C,2}, q_{C,3})^T$ is smaller than 0.

If the inner product in Inequality (17) is smaller than 0, the rotation direction of an object when using $Q_A$ is opposite to the rotation direction of the object when using $Q_C$. When the inner product is smaller than 0, a value of a logic expression shown in Inequality (17) is set as 'true'. When the inner product is greater than 0, the value of the logic expression is set as 'false'.

$$\begin{pmatrix} q_{B,1} \\ q_{B,2} \\ q_{B,3} \end{pmatrix} \cdot \begin{pmatrix} q_{C,1} \\ q_{C,2} \\ q_{C,3} \end{pmatrix} < 0 \qquad (18)$$

In Inequality (18), when the rotational differential value $Q_B$ input from the rotation direction error calculator 820 is expressed by $Q_B = (q_{B,0}, q_{B,1}, q_{B,2}, q_{B,3})^T$, $$\begin{pmatrix} q_{B,1} \\ q_{B,2} \\ q_{B,3} \end{pmatrix}$$

represents a three-dimensional vector $(q_{B,1}, q_{B,2}, q_{B,3})^T$ consisting of the four components $q_{B,0}, q_{B,1}, q_{B,2}$, and $q_{B,3}$ of $Q_B$ except for the first component $q_{B,0}$.

$$\begin{pmatrix} q_{C,1} \\ q_{C,2} \\ q_{C,3} \end{pmatrix}.$$

represents a three-dimensional vector $(q_{C,1}, q_{C,2}, q_{C,3})^T$ consisting of the four components $q_{C,0}, q_{C,1}, q_{C,2}$, and $q_{C,3}$ of $Q_C$ except for the first component $q_{C,0}$. Inequality (18) shows a condition that a inner product of the two 3D vectors $(q_{B,1}, q_{B,2}, q_{B,3})^T$ and $(q_{C,1}, q_{C,2}, q_{C,3})^T$ is smaller than 0.

If the inner product of in Inequality (18) is smaller than 0, the rotation direction of an object when using $Q_B$ is opposite to the rotation direction of the object when using $Q_C$. When the inner product is smaller than 0, a value of a logic expression shown in Inequality (18) is set as 'true'. When the inner product is greater than 0, the value of the logic expression is set as 'false'.

$$A_{TH} < 2 \cos^{-1}|q_{A,0}| \qquad (19)$$

In Inequality (19), $q_{A,0}$ represents the first component of the rotational differential value $Q_A$, and $A_{TH}$ is set to a predetermined constant close to 0. When in Inequality (19), $2 \cos^{-1}|q_{A,0}|$ is greater than $A_{TH}$, a value of a logic expression shown in Inequality (19) is defined as 'true'. When $2 \cos^{-1}|q_{A,0}|$ is not greater than $A_{TH}$, the value of the logic expression is defined as 'false'. When Inequality (19) is set as 'false', it means that a rotation angle $\theta(=2 \cos^{-1}|q_{A,0}|)$ smaller than the predetermined constant $A_{TH}$ can be ignored when realizing an apparatus for encoding key value data according to the present invention. Even though there exists as much a rotation direction error as the rotation angle $\theta$, the rotation direction error does not cause severely distorted images to human eyes, especially when using an error measurement method proposed by the present invention.

$$A_{TH} < 2 \cos^{-1}|q_{B,0}| \qquad (20)$$

In Inequality (20), $q_{B,0}$ represents the first component of the rotational differential value $Q_B$, and $A_{TH}$ is the same as the corresponding one in Inequality (19). When in Inequality (20), $2 \cos^{-1}|q_{B,0}|$ is greater than $A_{TH}$, a value of a logic expression shown in Inequality (20) is defined as 'true'. When $2 \cos^{-1}|q_{B,0}|$ is not greater than $A_{TH}$, the value of the logic expression is defined as 'false'.

$$A_{TH} < 2 \cos^{-1}|q_{C,0}| \qquad (21)$$

In Inequality (21), $q_{C,0}$ represents the first component of the rotational differential value $Q_C$, and $A_{TH}$ is the same as the corresponding one in Inequality (19). When in Inequality (21), $2 \cos^{-1}|q_{C,0}|$ is greater than $A_{TH}$, a value of a logic expression shown in Inequality (21) is defined as 'true'. When $2 \cos^{-1}|q_{C,0}|$ is not greater than $A_{TH}$, the value of the logic expression is defined as 'false'.

The rotation direction error detector 830 performs an AND operation on the logic values of Inequalities (17) through (21) and outputs the result of the AND operation to the rotation direction selector 835.

The first quaternion multiplier 810 has two input values $Q_i$ and $\hat{Q}_{i-1}$ at a predetermined moment of time t. The first quaternion multiplier 810 outputs a rotational differential value using the two input values $Q_i$ and $\hat{Q}_{i-1}$. As described above, in area 1, the apparatus for decoding encoded key value data, which receives rotational differential data, rotates an object clockwise. However, the object must rotate from a place where it is currently located after rotating by predetermined degrees indicated by $Q_{i-1}$ to a place where it is supposed to be located after rotating by predetermined degrees indicated by $Q_i$, and thus the original rotation direction of the object must be a counterclockwise direction.

Accordingly, the rotation direction corrector 815 corrects the rotation direction of the object so that the object can rotate by as much as a rotation angle indicated by $\hat{Q}_{i-1}$ in the same direction as it has rotated based on $\hat{Q}_i$, as shown in FIG. 7, i.e., so that the object can rotate counterclockwise from the place where it is currently located after rotating based on $\hat{Q}_{i-1}$ to the place where it is supposed to be located after rotating by as much as a rotation angle indicated by $\hat{Q}_i$.

For doing this, the rotation direction corrector 815 sets up new rotation information to make the object rotate counterclockwise by as much as 180 degrees from a place where it is currently located after rotating by predetermined degrees following $\hat{Q}_{i-1}$. Accordingly, the rotation direction of the object is corrected to be the same as the original one, and a rotation direction error can be minimized. The rotation direction corrector 815 receives the rotational differential data $\dot{Q}_i$ of the current keyframe from the first quaternion multiplier 810, generates rotational differential data having a corrected rotation direction, and outputs the corrected rotational differential data to the rotation direction selector 835 in step S926.

Figure 9A:
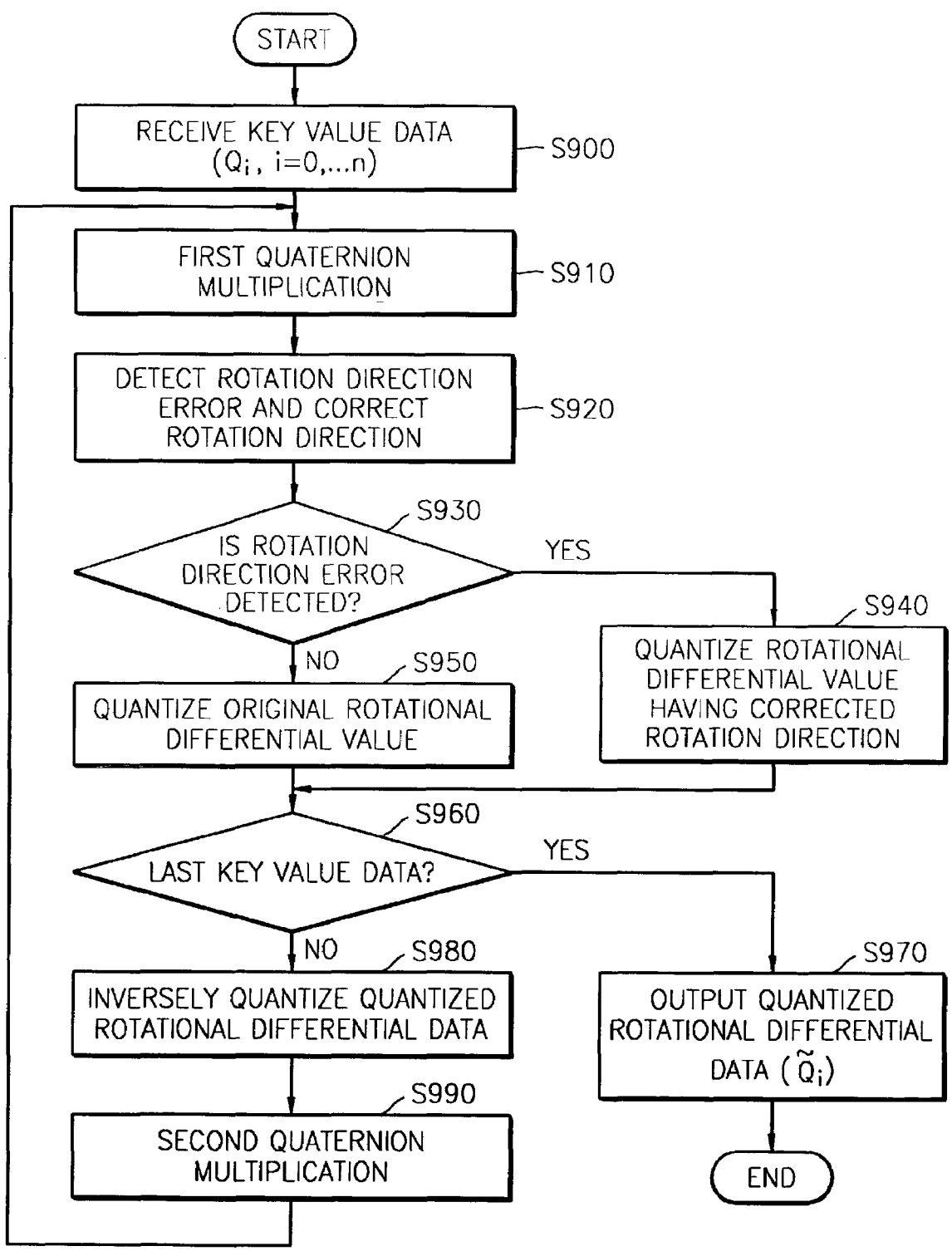
FIG. 9A is a flowchart of a circular DPCM operation according to a second embodiment of the present invention.
Figure 9B:
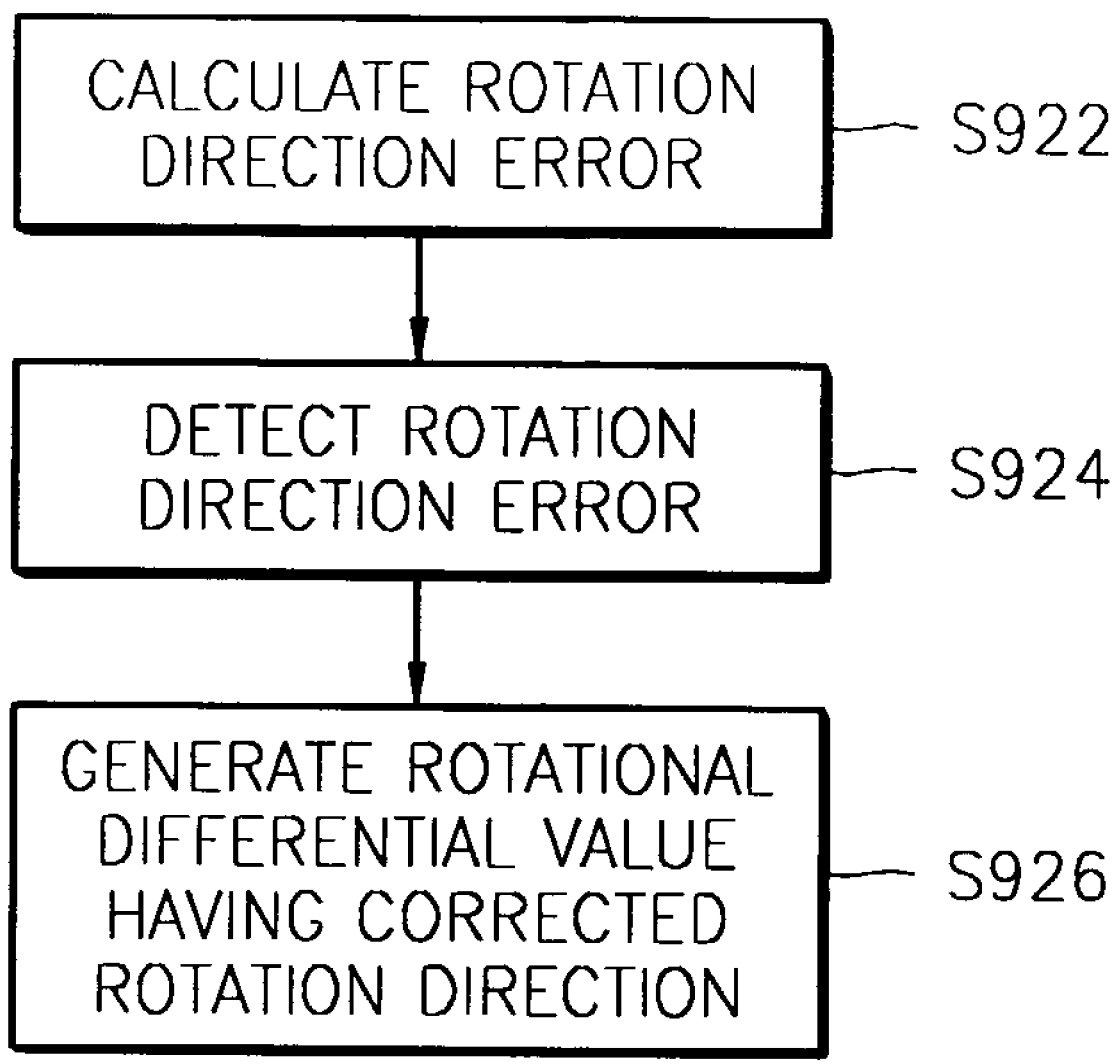
FIG. 9B is a flowchart illustrating the operations of a rotation direction error calculator, a rotation direction error detector, and a rotation direction corrector shown in FIG. 9A.

Referring to FIG. 9A, the rotation direction selector 835 checks if the logic values input from the rotation direction error detector 830 are true in step S930. If the input logic values are true, the rotation direction selector 835 determines that the same phenomenon as has occurred in area 1 shown in FIG. 7 has occurred and outputs the corrected rotational differential value $Q_s$ defined by Equation (16) to the quantizer 840 in step S940.

On the other hand, if the input logic values are false, the rotation direction selector 835 determines that the same phenomenon as has occurred in area 1 has not occurred and outputs the rotational differential value $\dot{Q}_i$ input from the first quaternion multiplier 810 to the quantizer 840 in step S950.

Hereinafter, an apparatus for encoding key value data according to a third embodiment of the present invention will be described.

Since the apparatuses for encoding key value data according to the first and second embodiments of the present invention encodes only three components among the four components of a rotational differential value, they may not be able to restore a first component value of the quaternion using Equation (11) because of a quantization error. For example, a first component of a restored rotational differential value may be an imaginary number.

In order to prevent the problem with encoding only three components of a quaternion, the apparatus for encoding key value data according to the third embodiment of the present invention includes a quantizer, which can appropriately adjust three quantized component values so that when decoding encoded key value data, the other component can be restored into a positive real number and distortion of images can be minimized.

The apparatus for encoding key value data according to the third embodiment of the present invention is the same as the apparatuses for encoding key value data according to the first or second embodiments of the present invention except for the structure of a quantizer, and thus only the structure of the quantizer will be described in the following.

Figure 10A:
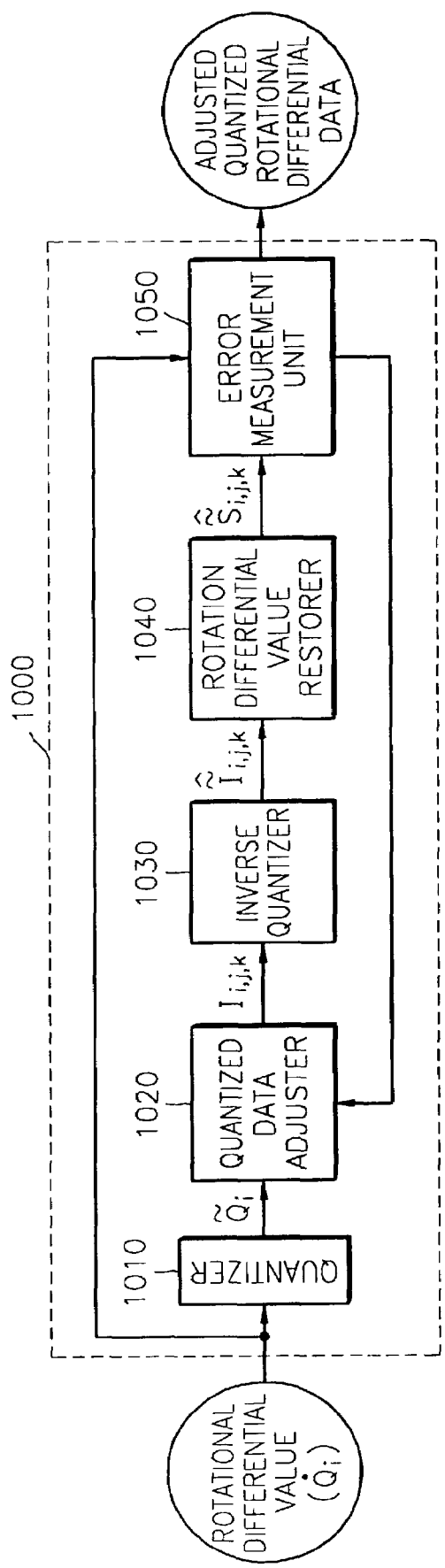
FIG. 10A is a block diagram of a quantizer included in an apparatus for encoding key value data according to a third embodiment of the present invention.

FIG. 10A is a block diagram of a quantizer included in an apparatus for encoding key value data according to the third embodiment of the present invention. Referring to FIG. 10A, a quantizer 1000 includes a quantization unit 1010, which quantizes a rotational differential value input thereinto, a quantization data adjustor 1020, which adjusts a quantized rotational differential value, an inverse quantizer 1030, which inversely quantizes quantized rotational differential data, a rotational differential value restorer 1040, which restores all component values of quantized rotational differential data by restoring a first component of the quantized rotational differential data using the inversely quantized components, and an error measurement unit 1050, which measures an error between a restored differential value and an originally input rotational differential value and renews quantized rotational differential data.

Figure 10B:
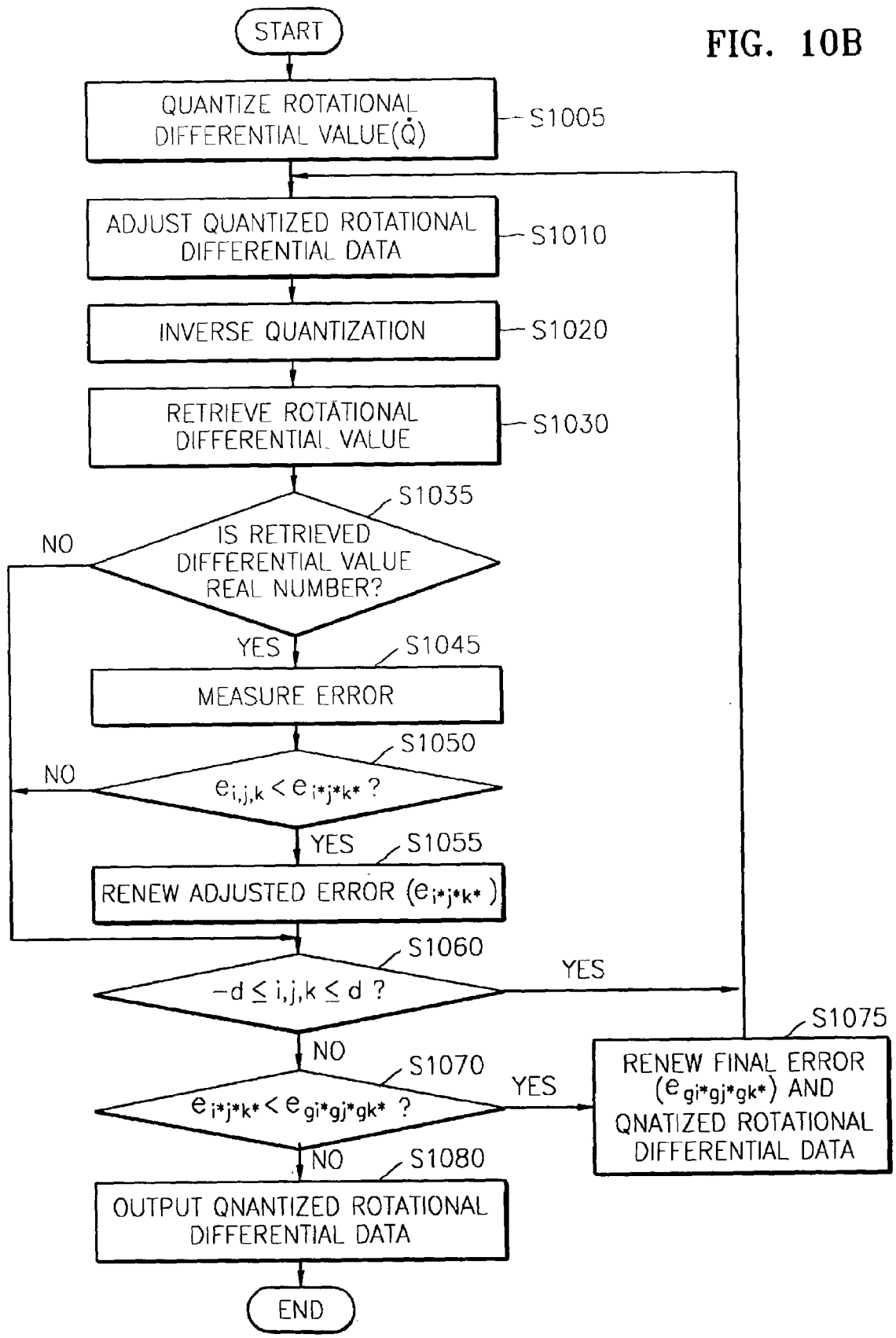
FIG. 10B is a flowchart of the operation of the quantizer according to the third embodiment of the present invention.

FIG. 10B is a flowchart of the operation of the quantizer 1010. Referring to FIG. 10B, when a rotational differential value $\dot{Q}$ is input from a first quaternion multiplier, the quantizer 1010 quantizes the input rotational differential value $\dot{Q}$ using Equation (10) and outputs quantized rotational differential data $\tilde{Q}$ to the quantization data adjustor 1020 in step S1005.

The quantization data adjustor 1020 adjusts three components of the quantized rotational differential data $\tilde{Q}$ following Equation (22) in step S1010.

$I_{ijk}=\tilde{Q}+D_{ijk}, D_{ijk}=(i, j, k)^T$ ($-d \leq i, j, k \leq d$ where $i, j, k$, and $d$ are integers) (22)

In Equation (22), i, j, and k are variables, which will be added to rotational differential data so as to adjust the rotational differential data, and d is used to define the range of i, j, and k. The three adjusted components of the quantized rotational differential data $\tilde{Q}$ are output to the inverse quantizer 1030.

The inverse quantizer 1030 inversely quantizes adjusted quantized rotational differential data $I_{ijk}$ and outputs inversely quantized rotational differential value $\hat{I}_{ijk}$ (or the results of the inverse quantization) to the rotational differential value restorer 1040 in step S1020.

The rotational differential value restorer 1040, which receives three components of the inversely quantized rotational differential value $\hat{I}_{ijk}$, restores a first component of rotational differential data following Equation (11) and outputs a restored rotational differential value to the error measurement unit 1050 in step S1030.

The error measurement unit 1050 checks a first component value of a rotational differential value input thereinto. If the first component value is a real number, the error measurement unit 1050 performs error measurement. On the other hand, if the first component value is an imaginary number, the method moves on to step S1060 in step S1040.

When the first component of the input rotational differential value is a real number, the error measurement unit 1050 measures an error $e_{ijk}$ between an original rotational differential value and a restored rotational differential value in step S1045 and checks if $e_{ijk}$ is smaller than an adjusted error $e_{i*j*k*}$ in step S1050. The method of measuring $e_{ijk}$ between the original rotational differential value and the restored rotational differential value will be described later with reference to FIG. 14.

If the measured error $e_{ijk}$ is smaller than the adjusted error $e_{i*j*k*}$, $e_{ijk}$ replaces $e_{i*j*k*}$ in step S1055 and then it is checked whether or not the variables i, j, and k belong to an adjustment range [−d, +d] in step S1060. If the variables i, j, and k belong to the adjustment range [−d, +d], the error measurement unit 1040 repeatedly performs steps S1010 through S1055. In step S1010 during each cycle of steps S1010 through S1055, 1 is added to second through fourth components of quantized rotational differential data in a nested loop fashion.

For example, a quantized data adjustor 1020 maintains the second and third components, tries to make the restored first component become a real value by adding a value of k to the fourth component value while gradually increasing the value of k by continuously adding 1 to the value of k ($-d \leq k \leq d$) before the value of k exceeds +d, and then finds four adjusted component values, which can minimize an error between an input rotational differential value and a restored rotational differential value.

If the value of k reaches +d, the quantized data adjustor 1020 tries to make the restored first component become a real value by initializing the value of k with −d and adding a value of j to the third component value while increasing the value of j by adding 1 to the value of j ($-d \leq j \leq d$) and adding a value of k to the fourth component value while gradually increasing the value of k by continuously adding 1 to the value of k ($-d \leq k \leq d$) before the value of k exceeds +d, and then finds four adjusted component values, which can minimize an error between an input rotational differential value and a restored rotational differential value.

If the value of j reaches +d, the quantized data adjustor 1020 tries to make the restored first component become a real value by initializing the values of j and k with −d and adding a value of i to the second component value while increasing the value of i by adding 1 to the value of i ($-d \leq i \leq d$) and adding a value of j to the third component value and adding a value of k to the fourth component value while gradually increasing the value of k by continuously adding 1 to the value of k ($-d \leq k \leq d$) before the value of k exceeds +d, and then finds four adjusted component values, which can minimize an error between an input rotational differential value and a restored rotational differential value.

The aforementioned process is repeated until i, j, k reach +d and the quantized data adjustor 1020 finds four adjusted component values, which can minimize an error between an input rotational differential value and a restored rotational differential value.

The error measurement unit 1050 checks if the adjusted error $e_{i*j*k*}$ is smaller than a final error $\dot{e}_{gi*gj*gk*}$ in step S1070 while changing the second through fourth component values. If $e_{i*j*k*}$ is smaller than $\dot{e}_{gi*gj*gk*}$, $e_{i*j*k}$ replaces $\dot{e}_{gi*gj*gk*}$ and quantized rotational differential data are corrected following Equation (23) in step S1075.

$\tilde{Q}^*=(\tilde{q}_1, \tilde{q}_2, \tilde{q}_3)^T+(i^*, j^*, k^*)^T$ (23)

Thereafter, the error measurement unit 1050 outputs the corrected rotational differential data to the quantized data adjustor 1020.

The quantized data adjustor 1020 sets the values of the variables i, j, and k to −d and performs steps S1010 through S1060 again on rotational differential data input thereinto. Then, the quantized data adjustor 1020 checks if there exists rotational differential data having a smaller error with the input rotational differential data than a previously stored final error.

If the adjusted error $e_{i^j^k^*}$ is not smaller than the final error $\dot{e}_{gi^gj^gk^*}$, the error measurement unit 1050 outputs quantized rotational differential data $\tilde{Q}^{g*}=\tilde{Q}^*=(\tilde{q}_1^*, \tilde{q}_2^*, \tilde{q}_3^*)^T$ corresponding to the currently stored final error $\dot{e}_{gi^gj^gk^*}$ to a circular DPCM operator in step S1080.

Hereinafter, an apparatus and a method for decoding an encoded bitstream, into which key value data are encoded using the apparatus for encoding key value data according to the present invention, will be described with reference to FIGS. 11A through 12.

FIG. 11A is a block diagram of an apparatus for decoding an encoded bitstream according to a preferred embodiment of the present invention. Referring to FIG. 11A, the apparatus for decoding an encoded bitstream according to the present invention includes a key value header decoder 1170, which decodes header information required for decoding key value data represented by a quaternion from an input bitstream and provides the decoded header information to a key value data decoder 1100, an entropy decoder 1110, which generates circular-DPCMed rotational differential data or quantized rotational differential data by entropy-decoding entropy-encoded key value data from the input bitstream, an inverse circular DPCM operator 1120, which generates quantized rotational differential data by performing an inverse circular DPCM operation on circular-DPCMed rotational differential data input thereinto, an inverse quantizer 1130, which generates a rotational differential value by inversely quantizing quantized rotational differential data, and a quaternion multiplier 1140, which generates a rotational transformation value of a current keyframe by quaternion-multiplying a rotational differential value of the current keyframe by a rotational transformation value of a previous keyframe.

Figure 11B:
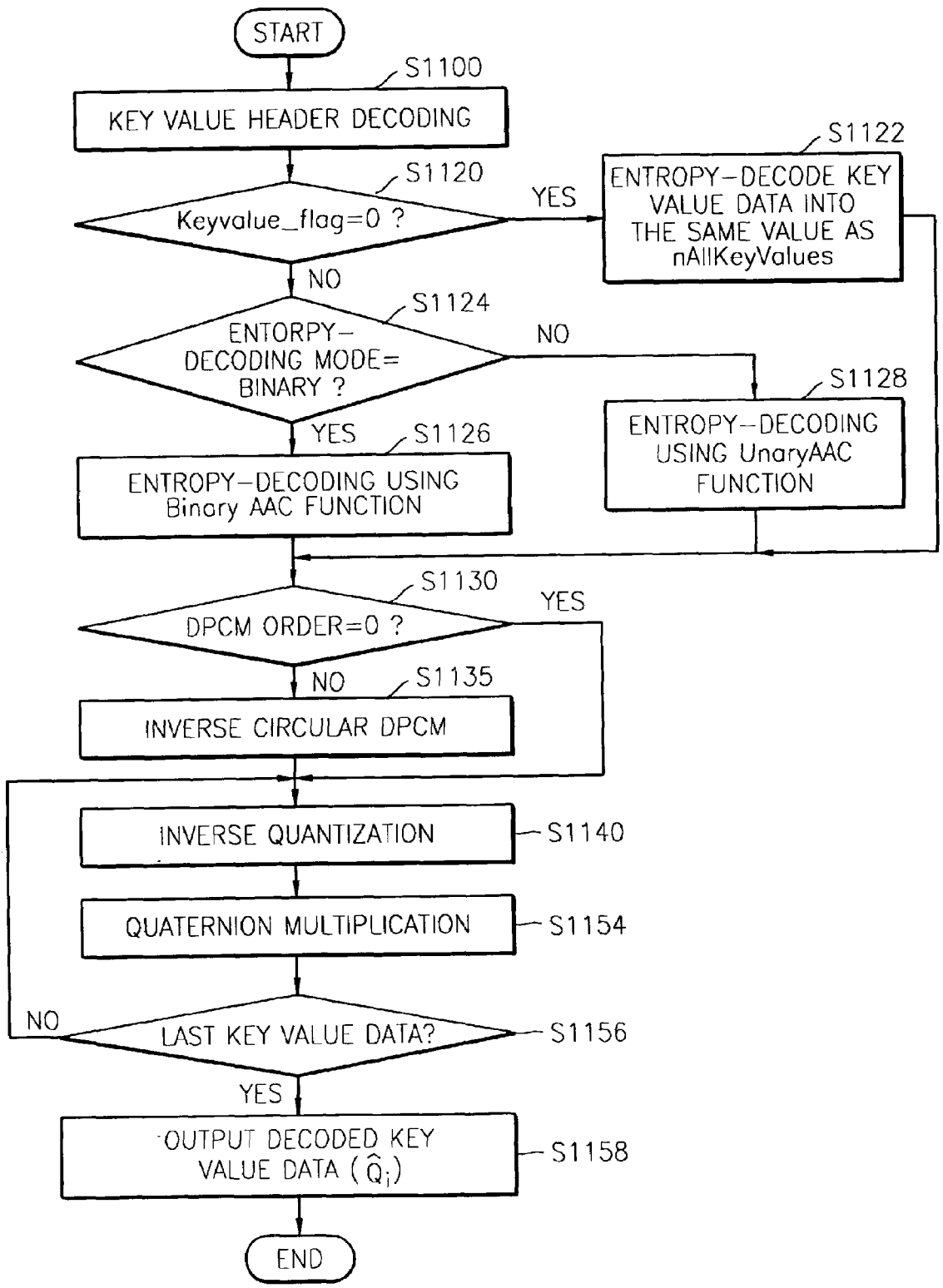
FIG. 11B is a flowchart of a method for decoding key value data according to a preferred embodiment of the present invention.

FIG. 11B is a flowchart of a method for decoding key value data according to a preferred embodiment of the present invention. Referring to FIG. 11B, a bitstream, into which key value data are encoded using the apparatus for encoding key value data according to the present invention, is input into the key value header decoder 1170 and the entropy decoder 1110 of the key value data decoder 1100.

The key value header decoder 1170 decodes header information required for decoding key value data from the input bitstream and provides the decoded header information to the key value data decoder 1100 in step S1100.

In the header information, first and second intra key value data quantized into quaternions based on the order of DPCM and a plurality of flags used to decode other key value data are encoded.

If the order of DPCM is 1 (for example, if nKVDPC-MOrder, which is one of the plurality of flags, is set to 0), first quantized key value data are included in the header information as intra key value data. If a quaternion value of first inversely quantized key value data satisfies $\hat{Q}_0=(\hat{q}_{0,0}, \hat{q}_{0,1}, \hat{q}_{0,2}, \hat{q}_{0,3})^T$, the first inversely quantized key value data are calculated following Equation (24).

$$\hat{q}_{0,0} = \tan\left(\frac{\pi}{4} * \left(\frac{|\text{firstQKV\_S}|}{2^{nKVQBit-1}-1}\right)\right) \quad (24)$$

$$\hat{q}_{0,1} = \tan\left(\frac{\pi}{4} * \left(xSign * \frac{|\text{firstQKV\_X}|}{2^{nKVQBit-1}-1}\right)\right)$$

$$\hat{q}_{0,2} = \tan\left(\frac{\pi}{4} * \left(ySign * \frac{|\text{firstQKV\_Y}|}{2^{nKVQBit-1}-1}\right)\right)$$

$$\hat{q}_{0,3} = \tan\left(\frac{\pi}{4} * \left(zSign * \frac{|\text{firstQKV\_Z}|}{2^{nKVQBit-1}-1}\right)\right)$$

In Equation (24), xSign is 1 only when nFirstXSign in class OrilDPCMKeyValueHeader, which will be described later, is 1 and is −1 under other conditions. ySign and zSign have the same relationships with nFirstYSign and nFirstZSign, respectively, as the relationship between xSign and nFirstXSign.

The restored quaternion component values defined by Equation (24) are converted into angular displacements to be used as an orientation interpolator. Each of the angular displacements restored from the key value data can be expressed by a four-dimensional vector $(\hat{x}_i, \hat{y}_i, \hat{z}_i, \hat{\theta}_i)^T$ where i represents current key data, $(\hat{x}_i, \hat{y}_i, \hat{z}_i)$ represents the vector of a rotation axis, and $\hat{\theta}_i$ represents a counterclockwise rotation angle. Accordingly, the restored quaternion component values are converted into angular displacements following Equation (25).

$$\hat{x}_0 = \hat{q}_{0,1} * \frac{1}{\sin\left(\frac{\theta_0}{2}\right)} \quad (25)$$

$$\hat{y}_0 = \hat{q}_{0,2} * \frac{1}{\sin\left(\frac{\theta_0}{2}\right)}$$

$$\hat{z}_0 = \hat{q}_{0,3} * \frac{1}{\sin\left(\frac{\theta_0}{2}\right)}$$

$$\hat{\theta}_0 = \arccos(\hat{q}_{0,0}) * 2$$

If the order of DPCM is 2, for example, if nKVDPC-MOrder is set to 1, first and second quantized key value data are included in the header information. The first quantized key value data are restored in the same way as described above. The second key value data, however, are restored in a different method. In other words, only three components of the second quantized key value data are transmitted along with an encoded bitstream and their values are not intra key value data but differential values $(\tilde{Q}_1=(\tilde{q}_{1,1}, \tilde{q}_{1,2}, \tilde{q}_{1,3}))$ with the first key value data. Supposing a quaternion representing the second key value data of inversely quantized key value data satisfies $\hat{Q}_1=(\hat{q}_{1,0}, \hat{q}_{1,1}, \hat{q}_{1,2}, \hat{q}_{1,3})^T$, $\hat{Q}_1$ is calculated following Equation (26).

$$\hat{\tilde{q}}_{1,0} = \sqrt{1 - \left(\hat{\tilde{q}}_{1,1}^2 + \hat{\tilde{q}}_{1,2}^2 + \hat{\tilde{q}}_{1,3}^2\right)} \quad (26)$$

$$\hat{\tilde{q}}_{1,1} = \tan\left(\frac{\pi}{4} * \left(secondXSign * \frac{|\text{secondQKV\_X}|}{2^{nKVQBit-1}-1}\right)\right)$$

-continued $$\hat{\tilde{q}}_{1,2} = \tan\left(\frac{\pi}{4} *\left(secondYSign * \frac{|secondQKV\_Y|}{2^{nKVQBit-1}-1}\right)\right)$$

$$\hat{\tilde{q}}_{1,3} = \tan\left(\frac{\pi}{4} *\left(secondZSign * \frac{|secondQKV\_Z|}{2^{nKVQBit-1}-1}\right)\right)$$

In Equation (26), secondXSign is 1 only when when nSecondXSign in class OrilDPCMKeyValueHeader is 1 and is −1 under other conditions. secondYSign and secondZSign have the same relationships with nSecondYSign and nSecondZSign, respectively as the relationship between secondXSign and nSecondXSign. If a quaternion $\hat{Q}_1$ representing second inversely quantized key value data satisfies $\hat{Q}_1 = (\hat{q}_{1,0}, \hat{q}_{1,1}, \hat{q}_{1,2}, \hat{q}_{1,3})^T$, $\hat{Q}_1$ is calculated by multiplying $\hat{\tilde{Q}}_1$ by $\hat{Q}_0$. In other words, $\hat{Q}_1 = \hat{\tilde{Q}}_1 \times \hat{Q}_0$.

The key value header decoder 1170 outputs decoded key value data and decoded header information to the key value decoder 1100.

The entropy decoder 1110 receives a bitstream, into which differential data of key value data are encoded, and entropy-decodes the input bitstream using decoding information decoded by the key value header decoder 1170 in steps S1120 through S1128.

FIG. 12 is a diagram illustrating the structure of a bitstream input into the entropy decoder 1110. In FIG. 12, supposing N (nNumberOfKeyValue) represents the number of encoded key value data, the number of rotational differential data of each component included in a bitstream is N−1 (0, 1, . . . , nNumberOfKeyValue−2) when the order of DPCM is 0. When the order of DPCM is 1, the number of rotational differential data of each of the components included in the bitstream is N−2 (0, 1, . . . , nNumberOfKeyValue−3).

The entropy decoder 1110 receives x_keyvalue_flag, y_keyvalue_flag, and z_keyvalue_flag from the key value header decoder 1170 and checks if x_keyvalue_flag, y_keyvalue_flag, and z_keyvalue_flag are each set to 1 in step S1120.

When x_keyvalue_flag, y_keyvalue_flag, and z_keyvalue_flag are each set to 0, it is considered that all quantized key value data or all differential data of each component are the same as nAllKeyValues in class OrilKeyValueCodingBit. Accordingly, the entropy decoder 1110 decodes the key value data of each of the components into the same value as nAllKeyValues input from the key value header decoder 1170 and outputs the decoded key value data to the inverse circular DPCM operator 1120 in step S1122.

If x_keyvalue_flag, y_keyvalue_flag, and z_keyvalue_flag are not set to 0, for example, if x_keyvalue_flag, y_keyvalue_flag, and z_keyvalue_flag are set to 1, the entropy decoder 1110 checks an entropy decoding mode input from the key value header decoder 1170 in order to decode each component of input key value data ($\overline{Q}_i = (\overline{q}_{i,1}, \overline{q}_{i,2}, \overline{q}_{i,3})$) in step S1124.

When the entropy decoding mode is a binary decoding mode, the entropy decoder 1110 decodes an adaptive-arithmetically encoded bitstream using a function decodeSignedAAC( ) shown in Table 1 and outputs quantized rotational differential data to the inverse circular DPCM operator 1120 in step S1126.

TABLE 1

```
void decodeSignedAAC(int *nDecodedValue, int qstep,
QState *signContext, QState *valueContext) {
    int b;
    b = qstep − 2;
    int msb = 0;
    do {
        qf_decode(&msb, &valueContext[b]);
        msb = msb << b;
    } while (msb == 0 && b >=0);
    int sgn = 0;
    int rest = 0;
    if(msb != 0) {
        qf_decode(&sgn, signContext);
        while (b >= 0) {
            int temp = 0;
            qf_decode(&temp, &valueContext[b]);
            rest |= (temp << b);
            b−−;
        }
    }
    if(sgn)
        *nDecodedValue = −(msb+rest);
    else
        *nDecodedValue = (msb+rest);
}
```

On the other hand, when the entropy decoding mode is not a binary decoding mode, the entropy decoder 1110 decodes the input bitstream using a function decodeUnaryAAC( ) in step S1128. The function decodeUnaryAAC( ) decodes the input bitstream by consecutively reading 0 until 1 is read from the bitstream, converting the number of successive 0s into its absolute value, reading a bit next to the bit '1', and converting the bit into a sign bit and then outputs quantized rotational differential data to the inverse circular DPCM operator 1120. An example of the function decodeUnaryAAC( ) is shown in Table 2.

TABLE 2

```
void decodeUnaryAAC(int* nDecodedValue, QState* signContext,
QState* valueContext)
{
    int nBits = −1;
    bit bBit;
    do {
        qf_decode(&bBit, valueContext);
        nBits++;
    } while(bBit == 0);
    if(nBits != 0) {
        qf_decode(&bBit, signContext);
        if(bBit == 0)
            * nDecodedValue = nBits;
        else
            * nDecodedValue = −nBits;
    }
    else
        * nDecodedValue = 0;
}
```

A function qf_decode( ) adopted in the aforementioned functions decodeSignedAAC( ) and decodeUnaryAAC( ) is used to read the bit 1 from an adaptive-arithmetically encoded bitstream and is defined by a document ISO/IEC 14496-2: 1999 Coding of Audio-Visual Objects: Visual, authorized by the International Standardization Organization.

The inverse circular DPCM operator 1120 receives the entropy-decoded key value data from the entropy decoder 1110 and checks the order of DPCM input from the key value header decoder 1170. If the order of DPCM is 0, the inverse circular DPCM operator 1120 outputs decoded rotational differential data $\check{Q}_{i-2}$ to the inverse quantizer 1130 in step S1130 since the entropy-decoded key value data input from the entropy decoder 1110 are quantized rotational differential data.

On the other hand, if the order of DPCM is 1, the inverse circular DPCM operator 1120 performs an inverse circular DPCM operation in step S1135 since the entropy-decoded key value data input from the entropy decoder 1110 are circular-DPCMed rotational differential data.

Supposing nKVQBit represents inverse quantization bits, the inverse circular DPCM operator 1120 performs an inverse circular DPCM operation on the rotational differential data $\check{Q}_{i-2}$ following Equation (27) and generates quantized rotational differential data $\check{Q}'_{i-2}$ in step S1135.

$$\check{Q}'_{i-2}=\check{Q}_{i-2}-(2^{nKVQBit}-1) \text{ (if } \check{Q}_{i-2} \geqq 0) \qquad (27)$$

$$\check{Q}'_{i-2}=\check{Q}_{i-2}+(2^{nKVQBit}-1) \text{ (if } \check{Q}_{i-2}<0)$$

$(i=2,\ldots,n\text{NumberOfKeyValue}-1)$

Thereafter, the inverse circular DPCM operator 1120 obtains an inversely DPCMed value A and an inversely DPCMed value B using $\check{Q}_{i-2}$ and $\check{Q}'_{i-2}$, respectively, which is shown in Equation (28).

$$A=\check{Q}_{i-2}+\tilde{Q}_{i-1} \qquad (28)$$

$$B=\check{Q}'_{i-2}+\tilde{Q}_{i-1}$$

$(i=2,\ldots,n\text{NumberOfKeyValue}-1)$

The inverse circular DPCM operator 1120 outputs B as inverse circular DPCMed data $\tilde{Q}_i$ if $B+(2^{nKVQBit-1}-1)$ is between 0 and a maximum value in a quantization range. On the other hand, the inverse circular DPCM operator 1120 outputs A as $\tilde{Q}_i$ if $B+(2^{nKVQBit-1}-1)$ is smaller than 0 or greater than the maximum value in the quantization range.

An example of C++ program codes, into which the aforementioned operation of the inverse circular DPCM operator 1120 is written, is shown in Table 3.

$$\hat{\tilde{q}}_{i,0} = \sqrt{1-\left(\hat{\tilde{q}}_{i,1}^2 + \hat{\tilde{q}}_{i,2}^2 + \hat{\tilde{q}}_{i,3}^2\right)} \qquad (29)$$

$$\hat{\tilde{q}}_{i,j} = \tan\left(\frac{\pi}{4}*\left(sgn(\tilde{q}_{i,j})*\frac{|\tilde{q}_{i,j}|}{2^{nKVQBit-1}-1}\right)\right)$$

$(i=2,\ldots,n\text{NumberOfKeyValue}-1, j=1,2,3)$

Thereafter, the quaternion multiplier 1140 receives the rotational differential value $\hat{Q}_i$. The quaternion multiplier 1140 restores a rotational transformation value $\hat{Q}_i$ (where $\hat{Q}_i = (\hat{q}_{i,0}, \hat{q}_{i,1}, \hat{q}_{i,2}, \hat{q}_{i,3})^T$ of a current keyframe in step S1154 by quaternion-multiplying the input rotational differential value $\hat{Q}_i$ by a rotational transformation value $\hat{Q}_{i-1}$ of a previous keyframe following Equation (30).

$$\hat{Q}_i=\hat{\tilde{Q}}_i \times \hat{Q}_{i-1} \qquad (30)$$

$(i=2,\ldots,n\text{NumberOfKeyValue}-1)$

After restoring a rotational transformation value, the key value data decoder 1100 checks if the restored rotational transformation value corresponds to last key value data in step S1156. If the restored rotational transformation value does not correspond to the last key value data, the key value data decoder 1100 repeatedly performs steps S1140 through S1154. On the other hand, if the restored rotational transformation value is the last key value data's, the key value data decoder 1100 outputs the restored rotational transformation value in step S1158.

If the order of DPCM is 0, the inverse circular DPCM operator 1120 outputs the decoded quantized rotational differential data $\check{Q}_i$ (where $\check{Q}_i=(\check{q}_{i,1}, \check{q}_{i,2}, \check{q}_{i,3})$) to the inverse quantizer 1130. Then, the inverse quantizer 1130 generates a rotational differential value $\hat{Q}_i$ (where $\hat{Q}_i=(\hat{q}_{i,0}, \hat{q}_{i,1}, \hat{q}_{i,2}, \hat{q}_{i,3})^T$) by inversely quantizing the rotational differential data

TABLE 3

```
ICDPCM(int* curIDPCMKeyValue, int deltaKeyValue, int prevICDPCMKeyValue)
{
    int circularDelta;
    int tempIDPCMKeyValue;
    prevICDPCMKeyValue += ((1 << (nKVQBit-1))-1);
    if(deltaKeyValue >= 0.0)
            circularDelta = deltaKeyValue - ((1 << nKVQBit)-1);
    else
            circularDelta = deltaKeyValue + ((1 << nKVQBit)-1);
    tempIDPCMKeyValue = circularDelta + prevICDPCMKeyValue;
    if((tempIDPCMKeyValue >= 0.0) && (tempIDPCMKeyValue < ((1 << nKVQBit)-1)))
            *curIDPCMKeyValue = tempIDPCMKeyValue;
    else
            *curIDPCMKeyValue = deltaKeyValue + prevICDPCMKeyValue;
    *curIDPCMKeyValue -= ((1 << (nKVQBit-1))-1);
}
```

The inverse quantizer 1130 receives the quantized rotational differential data ($\tilde{Q}_i=(\tilde{q}_{i,1}, \tilde{q}_{i,2}, \tilde{q}_{i,3})$) generated by the inverse circular DPCM operator 1120 performing an inverse circular DPCM operation, restores a rotational differential value ($\hat{\tilde{Q}}=(\hat{\tilde{q}}_{i,0}, \hat{\tilde{q}}_{i,1}, \hat{\tilde{q}}_{i,2}, \hat{\tilde{q}}_{i,3})^T$) by performing an inverse quantization operation on $\tilde{Q}_i$ following Equation (29), and outputs the rotational differential value $\hat{\tilde{Q}}_i$ to the quaternion multiplier 1140 in step S1140.

$\check{Q}_i$ input from the inverse circular DPCM operator 1120 and outputs $\hat{Q}_i$ to the quaternion multiplier 1140 in step S1140.

$$\hat{\tilde{q}}_{i,0} = \sqrt{1-\left(\hat{\tilde{q}}_{i,1}^2 + \hat{\tilde{q}}_{i,2}^2 + \hat{\tilde{q}}_{i,3}^2\right)} \qquad (31)$$

-continued $$\hat{\tilde{q}}_{i,j} = \tan\left(\frac{\pi}{4} * \left(sgn(\tilde{q}_{i,j}) * \frac{|\tilde{q}_{i,j}|}{2^{nKVQBit-1}-1}\right)\right)$$

$(i = 1, \ldots, nNumberOfKeyValue-1, j = 1, 2, 3)$

Even when the order of DPCM is 0, the quaternion multiplier 1140 restores rotational transformation values in almost the same way (steps S1150 through S1158) as it does when the order of DPCM is not 0. When the order of DPCM is not 0, the quaternion multiplier 1140 performs quaternion multiplication following Equation (32).

$$\hat{Q}_i = \hat{Q}_i \times \hat{Q}_{i-1} \quad (32)$$

$(i=1, \ldots, n\text{NumberOfKeyValue}-1)$

FIGS. 13A through 13E are diagrams illustrating examples of SDL-language program codes, into which the apparatus for decoding key value data according to the present invention is realized. Hereinafter, the meaning of each variable shown in FIGS. 13A through 13E will be described.

FIG. 13A is a diagram illustrating a class CompressedOrientationInterpolator. CompressedOrientationInterpolator is a top class used for reading an encoded bitstream of an orientation interpolator. OrilKeyValueHeader and OrilDPCMKeyValue are classes for information on key value data corresponding to key value field data in a conventional orientation interpolator. A function qf_start( ) is used to initialize an arithmetic decoder before reading a bitstream, into which key value data are encoded.

FIG. 13B is a diagram illustrating a class OrilKeyValueHeader. The meaning of each variable used in this class is as follows. nKVQBit represents an inverse quantization bit size of key value data. nNumKeyValueCodingBit represents the number of key value data. nKVDPCMOrder represents the order of inverse DPCM operation used for decoding key value data. When nKVDPCMOrder=0, an inverse circular DPCM operation does not need to be performed. On the other hand, when nKVDPCMOrder=1, an inverse circular DPCM operation is supposed to be performed.

FIG. 13C is a diagram illustrating a class OriDPCMKeyValueHeader. The meaning of each variable used in this class is as follows. firstQKV_S, firstQKV_X, firstQKV_Y, and firstQKV_Z represent first values of four components s, x, y, and z, respectively, constituting a quaternion (s, x, y, z) representing quantized key value data. nFirstXSign, nFirstYSign, and nFirstZSign represent signs of firstQKV_X, firstQKV_Y, and firstQKV_Z, respectively. secondQKV_X, secondQKV_Y, and second QKV_Z represent second values of the three components x, y, and z, respectively, and nSecondXSign, nSecondYSign, and nSecondZSign represent signs of secondQKV_X, secondQKV_Y, and second QKV_Z, respectively. bIsMoreTwoKVs indicates if there are more than two key value data to be decoded when an inverse circular DPCM is supposed to be performed. x_keyvalue_flag, y_keyvalue_flag, and z_keyvalue_flag indicate if all quantized values of each of the components x, y, and z, respectively, are the same.

FIG. 13D is a diagram illustrating a class OrilKeyValueCodingBit. The meaning of each variable used in this class is as follows. nKVCodingBit represents the number of bits used to store each component of all quaternion key value data except for intra key value data (firstQKV_S, firstQKV_X, firstQKV_Y, firstQKV_Z, second QKV_X, secondQKV_Y, and secondQKV_Z in the class OrilDPCMKeyValueHeader) after quantization.

nAllKeyValue represents a quantized value of each component of all key value data when keyvalue_flag for each of the components is set to 0. nSign represents the sign of nAllKeyValue. BlsUnaryAAC represents an adaptive-arithmetic quantization method used for decoding quantized values of each of the components x, y, and z. If blsUnaryAAC is set as 'true', an unary AAC decoding function will be used. On the other hand, if blsUnaryAAC is set as 'false', a binaryAAC decoding function will be used.

FIG. 13E is a diagram illustrating a class OrilDPCMKeyValue. The meaning of each value used in this class is as follows. DeltaKeyValue is used to store quantized key value data including the three components x, y, and z in the form of quaternion. The quantized key value data stored in DeltaKeyValue are decoded from a bitstream using a function decodeUnaryAAc or decodeSignedAAC.

kVXSignContext, kVYSignContext, and kVZSignContext are contexts used for decoding the three components x, y, and z of DeltaKeyValue using the function decodeUnaryAAC or decodeSignedAAC.

kVXUnaryContext, kVYUnaryContext, and kVZUnaryContext are contexts used for decoding the three components x, y, and z of DeltaKeyValue using the function decodeUnaryAAC.

KVXContext, kVYContext, and kVZContext are contexts used for decoding the three components x, y, and z of DeltaKeyValue using the function decodeSignedAAC.

Hereinafter, a method of measuring an error between an original rotational differential value and a rotational differential value restored by inversely quantizing a quantized rotational differential value in the error measurement unit 1050 included in a quantizer 1000 according to a third embodiment of the present invention will be described.

The method of measuring an error between an original rotational differential value and a restored rotational differential value according to the present invention can also be used for measuring an error between key value data of an orientation interpolator before encoding and key value data of the orientation interpolator obtained by decoding encoded key value data. Accordingly, in the following description of the error measurement method according to the present invention, the original rotational differential value and the restored rotational differential value will correspond to the original key value data before encoding and the key value data obtained by decoding encoded key value data, respectively.

In the process of encoding key value data of an orientation interpolator, an error occurs between original key value data and restored key value data during quantization. Here, the error between the original key value data and the restored key value data is defined by the difference between a rotation angle obtained using the original key value data and a rotation angle obtained from the restored key value data.

In other words, supposing that one key value datum included in an orientation interpolator node and its restored key value datum in a decoder are referred to as $(\vec{r}, \theta)$ and $(\vec{r}, \hat{\theta})$, respectively, where $\vec{r}$ represents a rotation axis, and $\theta$ represents a rotation angle and satisfies $\theta \in [-\pi, \pi]$ and that an object in a three-dimensional space is moved from an arbitrary position $\vec{x}$ to an arbitrary position $\vec{y}$ and from $\vec{y}$ to an arbitrary position $\hat{\vec{y}}$ based on $(\vec{r}, \theta)$ and $(\vec{r}, \hat{\theta})$, respectively, by rotation transformation, a quantization error is the difference between $\vec{y}$ and $\hat{\vec{y}}$ and satisfies $\vec{e}(\vec{x}) = \vec{y} - \hat{\vec{y}}$. $\vec{x}$, $\vec{y}$, and $\hat{\vec{y}}$ represented in the form of quaternion are shown in Equation (33).

$$X = (0, \vec{x}),\ Y = (0, \vec{y}),\ \hat{Y} = (0, \hat{\vec{y}}) \tag{33}$$

When quaternions representing $(\vec{r}, \theta)$ and $(\vec{r}, \hat{\theta})$ are referred to as Q and $\hat{Q}$, the following equations can be derived.

$$Y = Q \times X \times Q^* \tag{34}$$

$$X = Q^* \times Y \times Q$$

Here, A×B represents quaternion multiplication, and A* represents a conjugate of A. Based on Equations (33) and (34), the following equation can be derived.

$$\hat{Y} = \hat{Q} \times X \times \hat{Q}^* = \hat{Q} \times Q^* \times Y \times Q \times \hat{Q}^* = Q_{error} \times Y \times Q^*_{error} \tag{35}$$

Here, $Q_{error}$ is a value representing the relationship between $\vec{y}$ and $\hat{\vec{y}}$ in terms of rotation transformation and is defined by the following equation.

$$Q_{error} = \hat{Q} \times Q^* \tag{36}$$

When a differential rotation angle between $\vec{y}$ and $\hat{\vec{y}}$ is referred to as $\theta_{error}$, $\theta_{error}$ can be obtained using a quaternion transformation formula and Equation (36).

$$\theta_{error} = 2\cos^{-1} q_{0,error} = 2\cos^{-1}(\hat{Q} \cdot Q)\ \theta_{error} \in [0, \pi] \tag{37}$$

Here, • represents an inner product operation. Equation (37) defines an instantaneous quantization error occurring among all animation keyframes at a predetermined moment of time, and an instantaneous quantization error at a predetermined moment of time (t) can be defined by the following equation in order to derive a formula for obtaining a quantization error in an entire animation interval from Equation (37).

$$e(t) = 2\text{ arc cos }\{Q(t) \cdot \hat{Q}(t)\} \tag{38}$$

An average error $E_m$ and a maximum error $E_p$ can be derived by extensively applying Equation (38) to the entire keyframe interval, during which an animation is being performed using an orientation interpolator.

Figure 14:
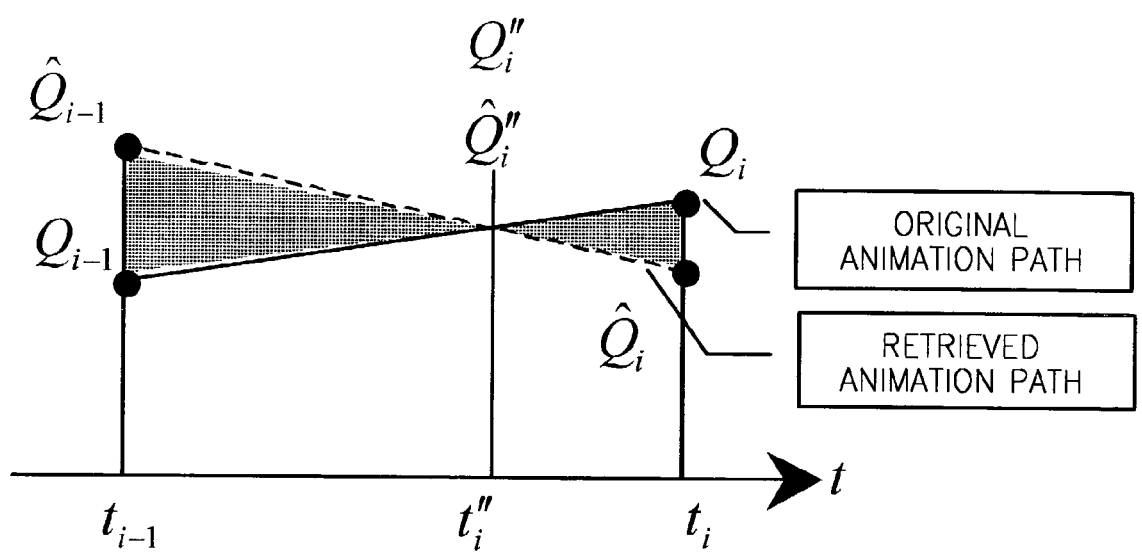
FIG. 14 is a diagram illustrating an example of a method for measuring an error between an original animation path and a restored animation path.

Here, in order to obtain the average error $E_m$, the partial sum $E_m^i$ of errors in an interval $[t_{i-1}, t_i]$ must be obtained first, as shown in FIG. 14. Hereinafter, decoded key value data corresponding to original key value data $Q_{i-1}$ and $Q_i$ will be referred to as $\hat{Q}_{i-1}$ and $\hat{Q}_i$, respectively.

Due to the fact that an animation path is distorted in a three-dimensional space, the interval $[t_{i-1}, t_i]$ must be divided into two sub-intervals $[t_{i-1}, t_i'']$ and $[t_i'', t_i]$ and the two sub-intervals must be calculated separately from each other. Here, let us assume that a distance between two animation paths, i.e., between a group of values of $Q_i$ and a group of values of $\hat{Q}_i$ is minimized at $t_i''$ in the interval $[t_{i-1}, t_i]$. Instantaneous errors at $t_{i-1}$ and $t_i$ are calculated using the following equations.

$$e_{i-1} = 2\text{ arc cos }(Q_{i-1} \cdot \hat{Q}_{i-1}) \tag{39}$$

$$e_i = 2\text{ arc cos }(Q_i \cdot \hat{Q}_i) \tag{60}$$

In addition, $t_i''$ in the interval $[t_{i-1}, t_i]$ is proportional to $$\frac{e_{i-1}}{e_i},$$

which is shown in Equation (40).

$$t_i'' = t_{i-1} + \frac{e_{i-1}}{e_{i-1} + e_i}(t_i - t_{i-1}) \tag{40}$$

Intermediate quaternion values and an instantaneous error at $t_i''$ are calculated following Equation (41).

$$Q_i'' = SLERP\left(Q_{i-1}, Q_i, \frac{t_i'' - t_{i-1}}{t_i - t_{i-1}}\right) \tag{41}$$

$$\hat{Q}_i'' = SLERP\left(\hat{Q}_{i-1}, \hat{Q}_i, \frac{t_i'' - t_{i-1}}{t_i - t_{i-1}}\right)$$

$$e_i'' = 2 \cdot \arccos(Q_i'' \cdot \hat{Q}_i'')$$

However, an instantaneous error at an arbitrary moment (t) of time is obtained following Equation (42).

$$e(t) = 2 \cdot \text{arc cos }(Q(t) \cdot \hat{Q}(t)) \tag{42}$$

Here, $$Q(t) = SLERP\left(Q_{i-1}, Q_i, \frac{t - t_{i-1}}{t_i - t_{i-1}}\right) \text{ and}$$

$$\hat{Q}(t) = SLERP\left(\hat{Q}_{i-1}, \hat{Q}_i, \frac{t - t_{i-1}}{t_i - t_{i-1}}\right).$$

However, it is not easy to calculate an instantaneous error $e(t)$ at an arbitrary moment (t) of time. Accordingly, $e(t)$ is determined using linear approximation, which is shown in Approximation (43).

$$e(t) \cong \begin{cases} e_{i-1} + \dfrac{t - t_{i-1}}{t_i'' - t_{i-1}}(e_i'' - e_{i-1}) & (t_{i-1} \leq t \leq t_i'') \\ e_i'' + \dfrac{t + t_i''}{t_i - t_i''}(e_i - e_i'') & (t_i'' \leq t \leq t_i) \end{cases} \tag{43}$$

The partial sum $E_m^i$ of errors in the interval $[t_{i-1}, t_i]$ and a partial sum $E_p^i$ of maximum errors in the interval $[t_{i-1}, t_i]$ can also be obtained using Approximations (43) and (44).

$$\begin{cases} E_p^t \equiv \max_{t_{i-1} \leq t \leq t_i} |e(t)| \\ E_m^t \equiv \int_{t_{i-1}}^{t_i''} e^2(t)\,dt + \int_{t_i''}^{t_i} e^2(t)\,dt \end{cases} \tag{44}$$

Approximation (45) can be rearranged as follows.

$$\begin{cases} E_p^t \cong \max\{|e_{i-1}|, |e_i''|, |e_i|\} \\ E \cong \dfrac{1}{3}(t_i'' - t_{i-1})\{(e_i'')^2 + e_{i-1}^2 + e_i'' e_{i-1}\} + \\ \qquad \dfrac{1}{3}(t_i - t_i'')\{e_i^2 + (e_i'')^2 + e_i e_i''\} \end{cases} \tag{45}$$

Finally, an average error $E_m$ and a maximum error $E_p$ in a time interval $[t_{min}, t_{max}]$ are calculated with Approximation (46) below.

$$E_m \cong \sqrt{\frac{1}{t_{max} - t_{min}} \Sigma_i E_m^i} \qquad (46)$$

$$E_p \cong \max_i E_p^i$$

Accordingly, the error measurement unit 1050 in the quantizer 1000 according to the third embodiment of the present invention calculates an error between original key value data and restored key value data following Equation (37) and can measure the degree to which images are distorted in a quaternion space due to a quantization error more precisely.

Figure 15:
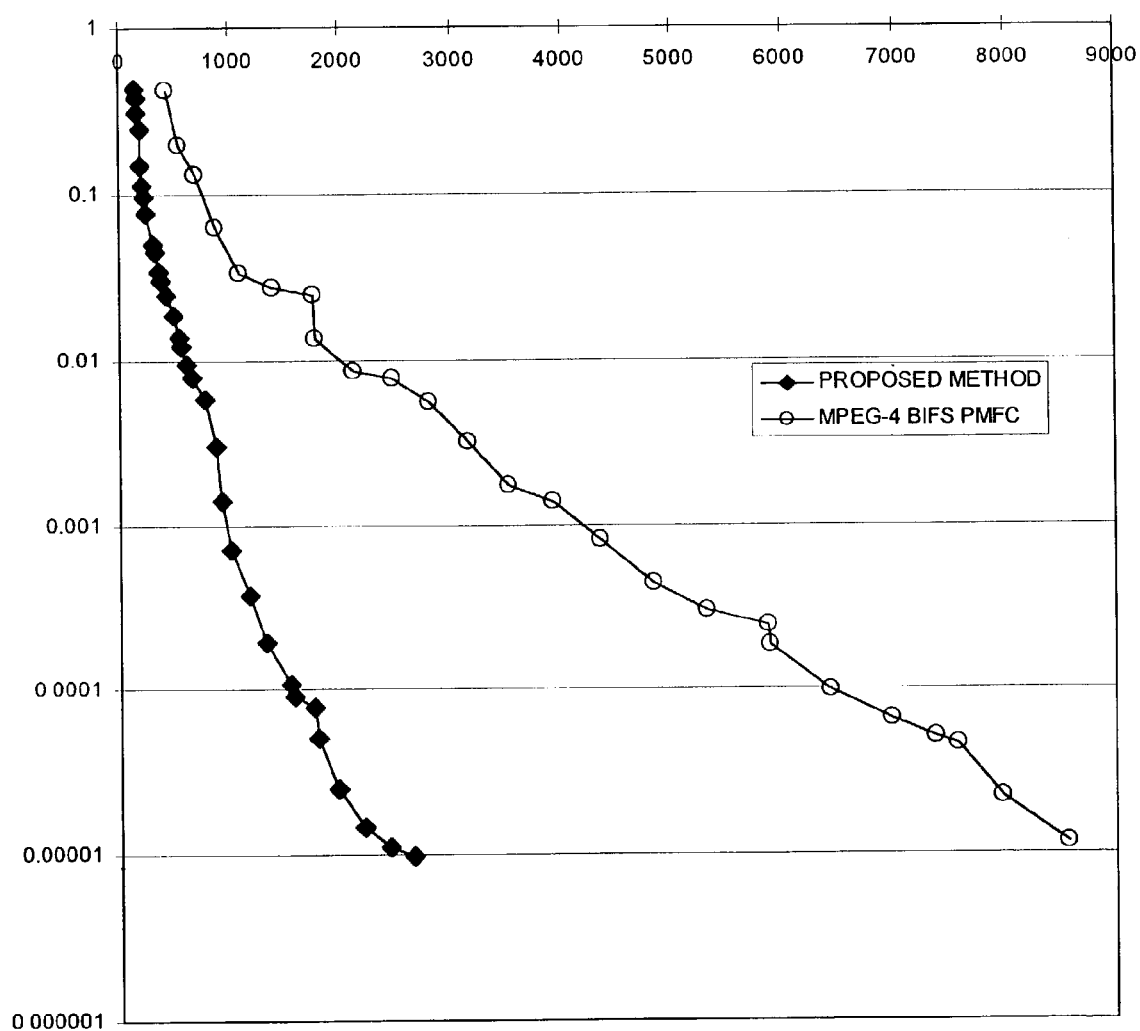
FIG. 15 is a diagram for comparing the performance of a method for encoding key value data according to the present invention with the performance of a conventional method for encoding key value data.

FIG. 15 is a graph showing the performance of the method for encoding key value data according to the present invention compared with a conventional method for encoding key value data. As shown in FIG. 15, according to the method for encoding key value data of the present invention, the degree, to which images are distorted when a predetermined number of bits required for encoding are given, can be lowered more considerably than in the conventional MPEG_4 BIFS PMFC method.

The present invention can be realized as computer-readable codes written on a computer-readable recording medium. Here, the computer-readable recording medium includes any kind of recording medium which can be read by a computer system. For example, the computer-readable recording medium includes a ROM, a RAM, a CD-ROM, a magnetic tape, a floppy disk, an optical data storage, carrier wave (transmission through the Internet). The computer-readable recording medium can be decentralized to computer systems connected over network, and a computer can read the recording medium in a decentralized way.

While this invention has been particularly shown and described with reference to preferred embodiments thereof, it will be understood by those skilled in the art that various changes in form and details may be made therein without departing from the spirit and scope of the invention as defined by the appended claims.

The method for encoding and decoding key value data of an orientation interpolator according to the present invention can effectively reduce redundancy among successive key value data to be encoded by encoding rotational differential values representing differences among rotational transformation values of keyframes.

In addition, according to the present invention, it is possible to prevent an object from being restored to rotate in an opposite direction to an original direction due to a quantization error by directly correcting the rotation direction of the object.

Moreover, since in the present invention, only second through fourth components having relatively small values among four components constituting a quaternion representing key value data are encoded and a first component is restored using the second through fourth components, which are adjusted so that the first component can be restored into a real number, it is possible to considerably reduce the size of data required for encoding.

What is claimed is:

1. An apparatus for generating rotational differential data, which generates differential data of rotational transformation values representing the rotation of an object in each frame, the apparatus comprising:

a first quaternion multiplier which generates a rotational differential value used to rotate an object by as much as a difference between rotational transformation applied to the object in a current keyframe by a rotational transformation value of the current frame and rotational transformation applied to the object in a previous keyframe by a restored rotational transformation value of the previous frame;

a quantization unit which generates rotational differential data by quantizing the rotational differential value;

an inverse quantization unit which generates a restored rotational differential value by inversely quantizing the rotational differential data; and a second quaternion multiplier which generates a restored rotational transformation value of the current frame by quaternion-multiplying the restored rotational differential value by a rotational transformation value of the previous frame.

2. The apparatus of claim 1, wherein the first quaternion multiplier generates a rotational differential value by quaternion-multiplying the rotational transformation value of the current frame by a conjugate of the restored rotational transformation value of the previous frame.

3. The apparatus of claim 1, wherein the quantization unit performs nonlinear quantization by which a region having a small rotational differential value can be quantized to have a higher resolution than a region having a great rotational differential value.

4. The apparatus of claim 1, wherein the quantization unit quantizes only three components among first through fourth components of the rotational differential value represented by a quaternion.

5. The apparatus of claim 1, wherein the quantization unit adjusts components of the rotational differential data so that a component value of a rotational differential value, which is restored using the component values of the rotational differential data and has not been quantized, can be converted into a real number and outputs the adjusted components of the rotational differential data.

6. The apparatus of claim 5, wherein the quantization unit generates final rotational differential data by adding/subtracting a variable in a predetermined adjustment range to/from each of the quantized components of the rotational differential data or to/from each of the adjusted components of the rotational differential data.

7. The apparatus of claim 1, wherein the quantization unit comprises:

a quantizer which generates rotational differential data by quantizing three component values of a rotational differential value input thereinto;

a quantized data adjustor which adjusts three component values of rotational differential data input thereinto;

an inverse quantizer which inversely quantizes the adjusted component values;

a rotational differential value restorer which generates a restored rotational differential value by restoring one component value, which has not been quantized, using the three inversely quantized component values; and an error measurement unit which measures an error between a rotational differential value input into the quantization unit and the restored rotational differential value and outputs rotational differential data having adjusted components so that the error can be minimized.

8. The apparatus of claim 7, wherein the error measurement unit renews an adjusted error with a current error between the rotational differential value input into the quantization unit and the restored rotational differential value if the current error is smaller than the adjusted error, renews a final error with the adjusted error if the adjusted error is smaller than the final error, and outputs adjusted rotational differential data corresponding to the adjusted error to the quantized data adjustor.

9. The apparatus of claim 1, wherein the inverse quantizer inversely quantizes quantized component values and restores a component value, which has not been quantized, using the inversely quantized component values.

10. The apparatus of claim 1 further comprising a rotation direction error detector which generates a first rotational differential value between the rotational transformation value of the current frame and the rotational transformation value of the previous frame, a second rotational differential value between the rotational transformation value of the previous frame and the restored rotational transformation value of the previous frame input from the second quaternion multiplier, and a third rotational differential value between the rotational transformation value of the current frame and the restored rotational transformation value of the previous frame and detects whether or not a rotation direction error has occurred.

11. The apparatus of claim 10, wherein the rotation direction error detector determines that the rotational direction error has occurred when the rotation direction of the object obtained from the first rotational differential value is opposite to the rotation direction of the object obtained from the third rotational differential value, the rotation direction of the object obtained from the second rotational differential value is opposite to the rotation direction of the object obtained from the third rotational differential value, and rotation angles obtained from the first through third rotational differential values exceed a predetermined critical rotation angle.

12. The apparatus of claim 1 further comprising:
a rotation direction error detector which receives the rotational transformation value of the current frame and the restored rotational transformation value of the previous frame from the second quaternion multiplier and detects whether or not a rotation direction error has occurred so that an original rotation direction of the object is opposite to a decoded rotation direction of the object;
a rotation direction corrector which adjusts the rotational differential value input from the first quaternion multiplier so that the original rotation direction of the object can be the same as the decoded rotational direction of the object and outputs the adjusted rotational differential value; and
a rotation direction selector which outputs the rotational transformation value input from the first quaternion multiplier or the adjusted rotational differential value input from the rotation direction corrector to the quantization unit depending on the result of the detection performed in the rotation direction error detector.

13. The apparatus of claim 12, wherein the quantization unit comprises:
a quantizer which generates rotational differential data by quantizing three component values of a rotational differential value input thereinto;
a quantized data adjustor which adjusts three component values of rotational differential data input thereinto;
an inverse quantizer which inversely quantizes the adjusted component values;
a rotational differential value restorer which generates a restored rotational differential value by restoring one component value, which has not bee quantized, using the three inversely quantized component values; and an error measurement unit which measures an error between a rotational differential value input into the quantization unit and the restored rotational differential value and outputs rotational differential data having adjusted component values so that the error can be minimized.

14. A method for generating rotational differential data, which generates differential data of rotational transformation values representing the rotation of an object in each frame, the method comprising:
(a) generating a rotational differential value used to rotate the object by as much as a difference between rotation transformations applied to the object in each of the frames using a rotational transformation value of a current frame and a restored rotational transformation value of a previous frame;
(b) generating rotational differential data by quantizing the rotational differential value;
(c) generating a restored rotational differential value by inversely quantizing the rotational differential value; and
(d) generating a restored rotational transformation value of a current frame by quaternion-multiplying the restored rotational differential value by a rotational transformation value of a previous frame and performing steps (a) through (d) again on the restored rotational transformation value of the current frame and a rotational transformation value of a next frame.

15. The method of claim 14, wherein in step (a), a rotational differential value is generated by quaternion-multiplying the rotational transformation value of the current frame by a conjugate of the restored rotational transformation value of the previous frame.

16. The method of claim 14, wherein in step (b), nonlinear quantization is performed so that a region having a small rotational differential value can be quantized to have a higher resolution than a region having a great rotational differential value.

17. The method of claim 14, wherein in step (b), only three components among first through fourth component values of the rotational differential value represented by a quaternion are quantized.

18. The method of claim 14, wherein in step (b), the quantized component values of the rotational differential data are adjusted so that a component value of a rotational differential value, which has not been quantized, is restored into a real value by inversely quantizing the component values of the rotational differential data and.

19. he method of claim 18, wherein in step (b), final rotational differential data are generated by adding/subtracting a variable in a predetermined adjustment range to/from each of the quantized components of the rotational differential data or to/from each of the adjusted components of the rotational differential data.

20. The method of claim 14, wherein step (b) comprises:
(b1) generating rotational differential data by quantizing three component values of the rotational differential value;
(b2) adjusting three component values of the rotational differential data;
(b3) inversely quantizing the adjusted component values;
(b4) generating a restored rotational differential value by restoring one component value, which has not been quantized, using the three inversely quantized component values; and
(b5) measuring an error between the rotational differential value and the restored rotational differential value and outputting rotational differential data having adjusted component values so that the error can be minimized.

21. The method of claim 20, wherein step (b5) comprises:
(b51) renewing an adjusted error with a current error between the rotational differential value and the restored rotational differential value if the current error is smaller than the adjusted error;
(b52) repeatedly performing steps (b2) through (b51) until the variable added to or subtracted from the rotational differential value in step (b2) is beyond the predetermined adjustment range; and
(b53) renewing a final error with the adjusted error if the adjusted error is smaller than the final error, performing steps (b2) through (b52) on adjusted rotational differential data corresponding to the adjusted error, and outputting adjusted rotational differential data corresponding the final error.

22. The method of claim 14, wherein in step (c), a component value of a rotational differential value, which has not been quantized, is restored by inversely quantizing the rotational differential data.

23. The method of claim 14, wherein step (a) further comprises (a2) detecting a rotation direction error by generating a first rotational differential value between the rotational transformation value of the current frame and the rotational transformation value of the previous frame, a second rotational differential value between the rotational transformation value of the previous frame and the restored rotational transformation value of the previous frame, and a third rotational differential value between the rotational transformation value of the current frame and the restored rotational transformation value of the previous frame.

24. The method of claim 23, wherein in step (a2), the rotational direction error is determined to have occurred when the rotation direction of the object obtained from the first rotational differential value is opposite to the rotation direction of the object obtained from the third rotational differential value, the rotation direction of the object obtained from the second rotational differential value is opposite to the rotation direction of the object obtained from the third rotational differential value, and rotation angles obtained from the first through third rotational differential values exceed a predetermined critical rotation angle.

25. A computer-readable recording medium where the method of claim 14 is recorded in computer-readable program codes.

26. A method for generating rotational differential data, which generates differential data of rotational transformation values representing the rotation of an object in each frame, the method comprising:

(a) generating a rotational differential value used to rotate the object by as much as a difference between rotational transformations applied to the object in the frames using a rotational transformation value of a current frame and a restored rotational transformation value of a previous frame;
(b) detecting whether or not a rotation direction error has occurred so that an original rotation direction of the object is opposite to a decoded rotation direction of the object, depending on the rotational transformation value of the current frame and the restored rotational transformation value of the previous frame;
(c) adjusting the rotational differential value generated in step (a) so that the original rotation direction of the object can be the same as the decoded rotation direction of the object;
(d) selecting the rotational differential value generated in step (a) or the adjusted rotational differential value depending on the result of the detection performed in step (b);
(e) generating rotational differential data by quantizing the selected rotational differential value;
(f) generating a restored rotational differential value by inversely quantizing the rotational differential data; and
(g) generating a restored rotational transformation value of the current frame by quaternion-multiplying the restored rotational differential value by a rotational transformation value of the previous frame.

27. The method of claim 26, wherein step (e) comprises:
(e1) generating rotational differential data by quantizing three component values of the selected rotational differential value;
(e2) adjusting three component values of the rotational differential data;
(e3) inversely quantizing the adjusted component values;
(e4) generating a restored rotational differential value by restoring one component value, which has not been quantized, using the three inversely quantized component values; and
(e5) measuring an error between the selected rotational differential value and the restored rotational differential value and outputting rotational differential data having adjusted component values so that the error can be minimized.

28. A computer-readable recording medium where the method of claim 26 is recorded in computer-readable program codes.

* * * * *